(12) United States Patent
Inubushi et al.

(10) Patent No.: US 10,414,144 B2
(45) Date of Patent: Sep. 17, 2019

(54) MULTILAYER STRUCTURE, METHOD FOR PRODUCING SAME, PACKAGING MATERIAL AND PRODUCT INCLUDING SAME, AND PROTECTIVE SHEET FOR ELECTRONIC DEVICE

(71) Applicant: KURARAY CO., LTD., Kurashiki-shi (JP)

(72) Inventors: Yasutaka Inubushi, Kurashiki (JP); Ryoichi Sasaki, Kurashiki (JP); Masahiko Ota, Kurashiki (JP)

(73) Assignee: KURARAY CO., LTD., Kurashiki-shi (JP)

( * ) Notice: Subject to any disclaimer, the term of this patent is extended or adjusted under 35 U.S.C. 154(b) by 141 days.

(21) Appl. No.: 15/539,393

(22) PCT Filed: Dec. 24, 2015

(86) PCT No.: PCT/JP2015/006459
§ 371 (c)(1),
(2) Date: Jun. 23, 2017

(87) PCT Pub. No.: WO2016/103719
PCT Pub. Date: Jun. 30, 2016

(65) Prior Publication Data
US 2018/0015713 A1    Jan. 18, 2018

(30) Foreign Application Priority Data

Dec. 24, 2014 (JP) ................. 2014-261118
Jan. 13, 2015 (JP) ................. 2015-004432
Jan. 13, 2015 (JP) ................. 2015-004433
May 27, 2015 (JP) ................. 2015-107959

(51) Int. Cl.
| B65D 65/40 | (2006.01) |
| B32B 27/08 | (2006.01) |
| B32B 27/32 | (2006.01) |
| B32B 27/36 | (2006.01) |
| B32B 27/34 | (2006.01) |
| B32B 7/12 | (2006.01) |
| B32B 27/26 | (2006.01) |
| B32B 27/10 | (2006.01) |
| B32B 27/00 | (2006.01) |
| B32B 37/15 | (2006.01) |
| B65D 81/24 | (2006.01) |
| H01L 31/048 | (2014.01) |
| H01L 31/049 | (2014.01) |
| A61J 1/14 | (2006.01) |
| A61J 1/10 | (2006.01) |
| B32B 27/06 | (2006.01) |
| B32B 29/00 | (2006.01) |
| B65D 75/40 | (2006.01) |
| H01L 51/52 | (2006.01) |

(52) U.S. Cl.
CPC ............... *B32B 37/15* (2013.01); *A61J 1/10* (2013.01); *A61J 1/1468* (2015.05); *B32B 7/12* (2013.01); *B32B 27/06* (2013.01); *B32B 27/08* (2013.01); *B32B 27/10* (2013.01); *B32B 27/32* (2013.01); *B32B 27/34* (2013.01); *B32B 27/36* (2013.01); *B32B 29/002* (2013.01); *B65D 65/40* (2013.01); *B65D 75/40* (2013.01); *B65D 81/24* (2013.01); *H01L 31/048* (2013.01); *H01L 31/049* (2014.12); *H01L 31/0481* (2013.01); *H01L 51/5253* (2013.01); *B32B 2250/03* (2013.01); *B32B 2250/24* (2013.01); *B32B 2255/10* (2013.01); *B32B 2255/12* (2013.01); *B32B 2255/26* (2013.01); *B32B 2255/28* (2013.01); *B32B 2307/306* (2013.01); *B32B 2307/412* (2013.01); *B32B 2307/7244* (2013.01); *B32B 2307/7246* (2013.01); *B32B 2439/46* (2013.01); *B32B 2571/00* (2013.01)

(58) Field of Classification Search
None
See application file for complete search history.

(56) References Cited

U.S. PATENT DOCUMENTS

| 2012/0006387 | A1 | 1/2012 | Adachi |
| 2013/0034674 | A1* | 2/2013 | Yoshida ............... C09D 123/02 428/35.2 |
| 2014/0248450 | A1 | 9/2014 | Sasaki et al. |
| 2015/0155409 | A1 | 6/2015 | Nakaya et al. |
| 2017/0088324 | A1 | 3/2017 | Sasaki et al. |

FOREIGN PATENT DOCUMENTS

| JP | 5873958 B1 | 3/2016 |
| WO | WO 2010/109947 A1 | 9/2010 |
| WO | WO 2011/122036 A1 | 10/2011 |
| WO | WO 2013/051288 A1 | 4/2013 |
| WO | WO 2013/187064 A1 | 12/2013 |

OTHER PUBLICATIONS

International Search Report dated Mar. 22, 2016 in PCT/JP2015/006459 filed Dec. 24, 2015.

* cited by examiner

*Primary Examiner* — Sheeba Ahmed
(74) *Attorney, Agent, or Firm* — Oblon, McClelland, Maier & Neustadt, L.L.P.

(57) ABSTRACT

The present invention relates to a multilayer structure including a base (X) and a layer (Y) stacked on the base (X). The layer (Y) contains a reaction product (D) of an aluminum-containing compound (A) and a phosphorus compound (B), and the reaction product (D) has an average particle diameter of 5 to 70 nm.

16 Claims, 6 Drawing Sheets

MULTILAYER STRUCTURE, METHOD FOR PRODUCING SAME, PACKAGING MATERIAL AND PRODUCT INCLUDING SAME, AND PROTECTIVE SHEET FOR ELECTRONIC DEVICE

TECHNICAL FIELD

The present invention relates to a multilayer structure, a method for producing the multilayer structure, a packaging material and product including the multilayer structure, and a protective sheet for electronic devices.

BACKGROUND ART

Multilayer structures in which a gas barrier layer containing aluminum or aluminum oxide as a component is formed on a plastic film have been conventionally well-known. Such multilayer structures are used as packaging materials for protecting articles (such as foods) which are susceptible to quality change induced by oxygen. In many cases, such a gas barrier layer is formed on a plastic film by a dry process such as physical vapor deposition (PVD) or chemical vapor deposition (CVD). Such a multilayer structure is used also as a component of a protective sheet for an electronic device to protect the characteristics of the electronic device when the electronic device is required to have gas barrier properties and water vapor barrier properties.

For example, aluminum-deposited films have light shielding properties as well as gas barrier properties and are typically used as packaging materials for dry foods.

Aluminum oxide-deposited films, which have transparency, are characterized by allowing visual recognition of contained substances and by enabling check for foreign matters with a metal detector and heating with a microwave oven. These films are thus used as packaging materials in a wide variety of applications such as retort food packaging.

For example, Patent Literature 1 discloses a multilayer structure having a gas barrier layer containing aluminum, the multilayer structure having a transparent gas barrier layer composed of a reaction product of aluminum oxide particles and a phosphorus compound. Patent Literature 1 discloses a method for forming the gas barrier layer, in which a coating liquid containing aluminum oxide particles and a phosphorus compound is applied onto a plastic film, then dried and heat-treated.

However, in some cases where the present inventors used the multilayer structure of Patent Literature 1 as a packaging material, the appearance of the packaged substance was poor due to insufficient transparency of the multilayer structure. In addition, in some cases where the multilayer structure was used as a packaging material for a retort food, the barrier performance deteriorated as a result of retorting. Furthermore, in some cases where the present inventors used the multilayer structure of Patent Literature 1 in an electronic device, the light transmittance was low due to insufficient transparency of the multilayer structure.

Under such circumstances, a multilayer structure having high transparency and capable of maintaining barrier performance even after retorting has been demanded. In addition, an electronic device including a multilayer structure having high transparency and high barrier performance has also been demanded.

CITATION LIST

Patent Literature

Patent Literature 1: WO 2011/122036 A1

SUMMARY OF INVENTION

Technical Problem

An object of the present invention is to provide a novel multilayer structure having good gas barrier properties and good water vapor barrier properties and further having high retort resistance and high transparency. Another object of the present invention is to provide a packaging material and product including a novel multilayer structure having good gas barrier properties and good water vapor barrier properties and further having high retort resistance and high transparency. Still another object of the present invention is to provide a method for producing a novel multilayer structure having good gas barrier properties and good water vapor barrier properties and further having high retort resistance. Still another object of the present invention is to provide a protective sheet for electronic devices that includes a novel multilayer structure that not only has good gas barrier properties and good water vapor barrier properties but also has high transparency and is capable of maintaining good gas barrier properties and good water vapor barrier properties even after a damp heat test.

Solution to Problem

As a result of a detailed study, the present inventors have found that a multilayer structure including particular layers meets the above objects, and has made the present invention on the basis of the finding.

The present invention provides a multilayer structure including a base (X) and a layer (Y) stacked on the base (X), wherein the layer (Y) contains a reaction product (D) of an aluminum-containing compound (A) and a phosphorus compound (B), and the reaction product (D) has an average particle diameter of 5 to 70 nm.

In the multilayer structure of the present invention, the phosphorus compound (B) may be an inorganic phosphorus compound (BI).

In the multilayer structure of the present invention, the aluminum-containing compound (A) may be an aluminum-containing metal oxide (Aa).

In the multilayer structure of the present invention, the base (X) may include at least one layer selected from the group consisting of a thermoplastic resin film layer and a paper layer.

The present invention also provides a method for producing the multilayer structure which includes a base (X) and a layer (Y) stacked on the base (X), the layer (Y) containing a reaction product (D) of an aluminum-containing compound (A) and a phosphorus compound (B), the method including the steps of: (I) applying a coating liquid (S) containing the aluminum-containing compound (A), the phosphorus compound (B), and a solvent onto the base (X) to form a layer (Y) precursor containing a reaction product (D) precursor; and (II) heat-treating the layer (Y) precursor at a temperature of 140° C. or higher to form the layer (Y), wherein the layer (Y) precursor formed in the step (I) has a solvent content of 0.4 wt % or less, and the reaction product (D) precursor has an average particle diameter of less than 5 nm.

In the method of the present invention for producing the multilayer structure, the step (I) includes a drying step of removing the solvent from the coating liquid (S) after applying the coating liquid (S) onto the base (X), and a drying temperature in the drying step is lower than 140° C.

The method of the present invention for producing the multilayer structure may be adapted so that, in an infrared absorption spectrum of the layer (Y) precursor obtained in the step (I), a ratio $A_R/A_P$ of a maximum $A_R$ of absorbance in a region from 1,080 to 1,130 cm$^{-1}$ to a maximum $A_P$ of absorbance in a region from 850 to 950 cm$^{-1}$ is 2.0 or less.

The present invention also provides a packaging material including any one of the multilayer structures as defined above.

The packaging material may further include a layer formed by extrusion coating lamination.

The packaging material may be a vertical form-fill-seal bag, a vacuum packaging bag, a pouch, a laminated tube container, an infusion bag, a paper container, a strip tape, a container lid, or an in-mold labeled container.

The present invention also provides a product inducing any one of the packaging materials as defined above at least in a part of the product.

The product of the present invention may be adapted to function as a vacuum insulator; that is, the product may have an interior with a reduced pressure and include a substance contained in the interior, the substance being a core material.

The present invention also provides a protective sheet for electronic devices, the protective sheet including any one of the multilayer structures as defined above.

The protective sheet of the present invention may be a protective sheet for protecting a surface of a photoelectric conversion device, information display device, or lighting device.

The present invention also provides an electronic device including any one of the protective sheets as defined above.

Advantageous Effects of Invention

The present invention makes it possible to obtain a novel multilayer structure having good gas barrier properties and good water vapor barrier properties and further having high retort resistance and high transparency. That is, the present invention makes it possible to obtain a novel multilayer structure that not only has good gas barrier properties and good water vapor barrier properties but also has high transparency and is capable of maintaining high barrier performance even after retorting. The present invention also makes it possible to obtain a packaging material and product including a novel multilayer structure having good gas barrier properties and good water vapor barrier properties and further having high retort resistance and high transparency. That is, the present invention makes it possible to obtain a packaging material and product including a novel multilayer structure that not only has good gas barrier properties and good water vapor barrier properties but also has high transparency and is capable of maintaining high barrier performance even after retorting. Furthermore, the present invention makes it possible to obtain a protective sheet for electronic devices that includes a novel multilayer structure that not only has good gas barrier properties and good water vapor barrier properties but also has high transparency and is capable of maintaining good gas barrier properties and good water vapor barrier properties even after a damp heat test.

DESCRIPTION OF EMBODIMENTS

Figure 1:
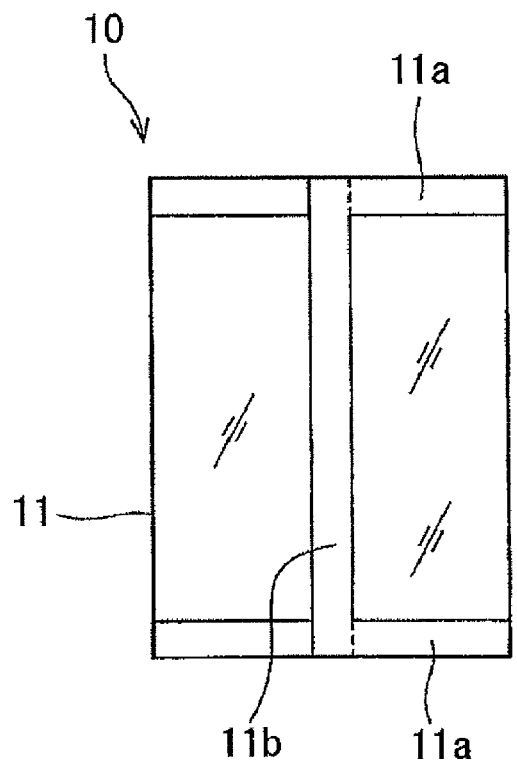
FIG. 1 is a schematic diagram of a vertical form-fill-seal bag according to an embodiment of the present invention.

Hereinafter, the present invention will be described with reference to examples. The following description gives examples of materials, conditions, techniques, and value ranges; however, the present invention is not limited to those mentioned as examples. The materials given as examples may be used alone or may be used in combination with one another, unless otherwise specified.

Unless otherwise specified, the meaning of an expression like "a particular layer is stacked on a particular member (such as a base or layer)" as used herein encompasses not only the case where the particular layer is stacked in contact with the member but also the case where the particular layer is stacked above the member, with another layer interposed therebetween. The same applies to expressions like "a particular layer is formed on a particular member (such as a base or layer)" and "a particular layer is disposed on a particular member (such as a base or layer)". Unless otherwise specified, the meaning of an expression like "a liquid (such as a coating liquid) is applied onto a particular member (such as a base or layer)" encompasses not only the case where the liquid is applied directly to the member but also the case where the liquid is applied to another layer formed on the member.

Herein, a layer may be termed "layer (Y)" using a reference character "(Y)" to differentiate the layer from other layers. The reference character "(Y)" has no technical meaning, unless otherwise specified. The same applies to other reference characters used in the terms such as "base (X)" and "compound (A)". However, an exception is made for the terms such as "hydrogen atom (H)" in which the reference character obviously represents a specific element.

[Multilayer Structure]

The multilayer structure of the present invention includes a base (X) and a layer (Y) containing aluminum. The layer (Y) contains a reaction product (D) of an aluminum-containing compound (A) (which hereinafter may be simply referred to as "compound (A)") and a phosphorus compound (B). The term "multilayer structure" as used in the following description refers to a multilayer structure that includes the base (X) and the layer (Y), unless otherwise specified.

The reaction product (D) is in the form of particles having an average particle diameter of 5 nm or more and 70 nm or less. The lower limit of the average particle diameter is preferably 10 nm or more, more preferably 15 nm or more, and even more preferably 20 nm or more. The upper limit of the average particle diameter is preferably 60 nm or less, more preferably 50 nm or less, and even more preferably 30 nm or less. The average particle diameter is preferably 10 nm or more and 60 nm or less, more preferably 15 nm or more and 50 nm or less, and even more preferably 15 nm or more and 30 nm or less. If the particle diameter is less than 5 nm, the barrier performance deteriorates after retorting. If the particle diameter is more than 70 nm, sufficient barrier performance cannot be achieved and the light transmittance is reduced. That is, when the average particle diameter of the reaction product (D) is in the range indicated above, both high transparency and good barrier performance can be achieved. The method for measuring the average particle diameter of the reaction product (D) is as described in "EXAMPLES" below.

The average particle diameter of the reaction product (D) can be controlled by adjusting, or appropriately combining, the concentration of a solution used for reaction, the viscosity of a coating liquid, the temperature conditions (such as reaction temperature, drying temperature, and heat treatment temperature), and the mixing ratio between the compound (A) and the phosphorus compound (B) (such as the molar ratio between aluminum atoms and phosphorus atoms).

The average particle diameter of a reaction product (D) precursor in a precursor layer of the layer (Y) is preferably less than 5 nm and, in terms of achieving good barrier performance even after retorting under harsh conditions, is more preferably less than 4 nm and even more preferably less than 3 nm. When the average particle diameter of the reaction product (D) precursor in the dried precursor layer of the layer (Y) is in the above range, the average particle diameter of the reaction product (D) in the resulting layer (Y) is small so that better barrier performance is achieved. The lower limit of the average particle diameter of the reaction product (D) precursor is not particularly defined. The average particle diameter may be, for example, 0.1 nm or more or may be 1 nm or more. The method for measuring the average particle diameter of the reaction product (D) precursor is as described in "EXAMPLES" below.

The base (X) and the layer (Y) will now be described.

[Base (X)]

The material of the base (X) is not particularly limited, and a base made of any of various materials can be used. Examples of the material of the base (X) include: resins such as thermoplastic resins and thermosetting resins; fiber assemblies such as fabrics and paper; wood; and glass. Among these, thermoplastic resins and fiber assemblies are preferred, and thermoplastic resins are more preferred. The form of the base (X) is not particularly limited. The base (X) may be a laminar base such as a film or sheet. The base (X) preferably includes at least one layer selected from the group consisting of a thermoplastic resin film layer and a paper layer, more preferably includes a thermoplastic resin film layer, and is even more preferably a thermoplastic resin film layer.

Examples of thermoplastic resins that may be used in the base (X) include: polyolefin resins such as polyethylene and polypropylene; polyester resins such as polyethylene terephthalate (PET), polyethylene-2,6-naphthalate, polybutylene terephthalate, and copolymers thereof polyamide resins such as nylon-6, nylon-66, and nylon-12; hydroxy group-containing polymers such as polyvinyl alcohol and ethylene-vinyl alcohol copolymer; polystyrene; poly(meth) acrylic acid esters; polyacrylonitrile; polyvinyl acetate; polycarbonate; polyarylate; regenerated cellulose; polyimide; polyetherimide; polysulfone; polyethersulfone; polyetheretherketone; and ionomer resins. When the multilayer structure is used as or in a packaging material, the material of the base (X) is preferably at least one thermoplastic resin selected from the group consisting of polyethylene, polypropylene, polyethylene terephthalate, nylon-6, and nylon-66.

When a film made of such a thermoplastic resin is used as the base (X), the base (X) may be an oriented film or non-oriented film. In terms of high suitability for processes (such as printing and lamination) of the resulting multilayer structure, an oriented film, particularly a biaxially-oriented film, is preferred. The biaxially-oriented film may be a biaxially-oriented film produced by any one method selected from simultaneous biaxial stretching, sequential biaxial stretching, and tubular stretching.

Examples of paper that may be used in the base (X) include kraft paper, high-quality paper, simili paper, glassine paper, parchment paper, synthetic paper, white paperboard, manila board, milk carton board, cup paper, and ivory paper. The use of paper in the base (X) makes it possible to obtain a multilayer structure for a paper container.

When the base (X) is in the form of a layer, the thickness of the base (X) is preferably 1 to 1,000 μm, more preferably 5 to 500 μm, and even more preferably 9 to 200 μm, in terms of high mechanical strength and good processability of the resulting multilayer structure.

[Layer (Y)]

The layer (Y) contains the reaction product (D) of the compound (A) and the phosphorus compound (B). The compound (A) is an aluminum-containing compound. The phosphorus compound (B) has a functional group containing a phosphorus atom. The phosphorus compound (B) includes an inorganic phosphorus compound (BI) and/or organic phosphorus compound (BO). The compound (A) and the phosphorus compound (B) will now be described.

[Aluminum-Containing Compound (A)]

The compound (A) is preferably an aluminum-containing metal oxide (Aa) (which hereinafter may be simply referred to as "metal oxide (Aa)").

[Aluminum-Containing Metal Oxide (Aa)]

The aluminum-containing metal oxide (Aa) is typically in the form of particles when reacted with the inorganic phosphorus compound (BI).

The metal atoms constituting the aluminum-containing metal oxide (Aa) (the metal atoms may be collectively referred to as "metal atoms (M)") include at least one metal atom selected from atoms of metals belonging to Groups 2 to 14 of the periodic table, and include at least aluminum atoms. The metal atoms (M) may consist only of aluminum atoms or may include aluminum atoms and other metal atoms. A combination of two or more metal oxides (Aa) may be used as the metal oxide (Aa).

The proportion of aluminum atoms in the metal atoms (M) is typically 50 mol % or more, and may be 60 mol % to 100 mol % or 80 mol % to 100 mol %. Examples of the metal oxide (Aa) include metal oxides produced by methods such as liquid-phase synthesis, gas-phase synthesis, and solid grinding.

The metal oxide (Aa) may be a hydrolytic condensate of a compound (E) containing the metal atom (M) to which a hydrolyzable characteristic group is bonded. Examples of the characteristic group include $R^1$ in the general formula [I] described below. The hydrolytic condensate of the compound (E) can be regarded substantially as a metal oxide. Thus, the hydrolytic condensate of the compound (E) may be referred to as "metal oxide (Aa)" herein. That is, the term "metal oxide (Aa)" as used herein is interchangeable with the term "hydrolytic condensate of the compound (E)", while the term "hydrolytic condensate of the compound (E)" as used herein is interchangeable with the term "metal oxide (Aa)".

[Compound (E) Containing Metal Atom (M) to which Hydrolyzable Characteristic Group is Bonded]

In terms of ease of control of reaction with the inorganic phosphorus compound (BI) and in terms of good gas barrier properties of the resulting multilayer structure, the compound (E) preferably includes at least one compound (Ea) represented by the following general formula [I].

$$Al(R^1)_k(R^2)_{3-k} \quad [I]$$

In this formula, $R^1$ is a halogen atom (such as a fluorine atom, chlorine atom, bromine atom, or iodine atom), $NO_3$, an optionally substituted alkoxy group having 1 to 9 carbon atoms, an optionally substituted acyloxy group having 2 to 9 carbon atoms, an optionally substituted alkenyloxy group having 3 to 9 carbon atoms, an optionally substituted β-diketonato group having 5 to 15 carbon atoms, or a diacylmethyl group having an optionally substituted acyl group having 1 to 9 carbon atoms. $R^2$ is an optionally substituted alkyl group having 1 to 9 carbon atoms, an optionally substituted aralkyl group having 7 to 10 carbon atoms, an optionally substituted alkenyl group having 2 to 9 carbon atoms, or an optionally substituted aryl group having 6 to 10 carbon atoms. k is an integer of 1 to 3. When there are two or more atoms or groups represented by $R^1$, the atoms or groups represented by $R^1$ may be the same as or different from each other. When there are two or more atoms or groups represented by $R^2$, the atoms or groups represented by $R^2$ may be the same as or different from each other.

The compound (E) may include, in addition to the compound (Ea), at least one compound (Eb) represented by the following general formula [II].

$$M^1(R^3)_m(R^4)_{n-m} \quad [II]$$

In this formula, $M^1$ is at least one metal atom different from an aluminum atom and selected from atoms of metals belonging to Groups 2 to 14 of the periodic table. $R^3$ is a halogen atom (such as a fluorine atom, chlorine atom, bromine atom, or iodine atom), $NO_3$, an optionally substituted alkoxy group having 1 to 9 carbon atoms, an optionally substituted acyloxy group having 2 to 9 carbon atoms, an optionally substituted alkenyloxy group having 3 to 9 carbon atoms, an optionally substituted β-diketonato group having 5 to 15 carbon atoms, or a diacylmethyl group having an optionally substituted acyl group having 1 to 9 carbon atoms. $R^4$ is an optionally substituted alkyl group having 1 to 9 carbon atoms, an optionally substituted aralkyl group having 7 to 10 carbon atoms, an optionally substituted alkenyl group having 2 to 9 carbon atoms, or an optionally substituted aryl group having 6 to 10 carbon atoms. m is an integer of 1 to n. n is equal to the valence of $M^1$. When there are two or more atoms or groups represented by $R^3$, the atoms or groups represented by $R^3$ may be the same as or different from each other. When there are two or more atoms or groups represented by $R^4$, the atoms or groups represented by $R^4$ may be the same as or different from each other.

Examples of the alkoxy groups represented by $R^1$ and $R^3$ include methoxy, ethoxy, n-propoxy, isopropoxy, n-butoxy, isobutoxy, sec-butoxy, tert-butoxy, benzyloxy, diphenylmethoxy, trityloxy, 4-methoxybenzyloxy, methoxymethoxy, 1-ethoxyethoxy, benzyloxymethoxy, 2-trimethylsilylethoxy, 2-trimethylsilylethoxymethoxy, phenoxy, and 4-methoxyphenoxy groups.

Examples of the acyloxy groups represented by $R^1$ and $R^3$ include acetoxy, ethylcarbonyloxy, n-propylcarbonyloxy, isopropylcarbonyloxy, n-butylcarbonyloxy, isobutylcarbonyloxy, sec-butylcarbonyloxy, tert-butylcarbonyloxy, and n-octylcarbonyloxy groups.

Examples of the alkenyloxy groups represented by $R^1$ and $R^3$ include allyloxy, 2-propenyloxy, 2-butenyloxy, 1-methyl-2-propenyloxy, 3-butenyloxy, 2-methyl-2-propenyloxy, 2-pentenyloxy, 3-pentenyloxy, 4-pentenyloxy, 1-methyl-3-butenyloxy, 1,2-dimethyl-2-propenyloxy, 1,1-dimethyl-2-propenyloxy, 2-methyl-2-butenyloxy, 3-methyl-2-butenyloxy, 2-methyl-3-butenyloxy, 3-methyl-3-butenyloxy, 1-vinyl-2-propenyloxy, and 5-hexenyloxy groups.

Examples of the β-diketonato groups represented by $R^1$ and $R^3$ include 2,4-pentanedionato, 1,1,1-trifluoro-2,4-pentanedionato, 1,1,1,5,5,5-hexafluoro-2,4-pentanedionato, 2,2,6,6-tetramethyl-3,5-heptanedionato, 1,3-butanedionato, 2-methyl-1,3-butanedionato, 2-methyl-1,3-butanedionato, and benzoylacetonato groups.

Examples of the acyl groups of the diacylmethyl groups represented by $R^4$ and $R^3$ include: aliphatic acyl groups having 1 to 6 carbon atoms such as formyl, acetyl, propionyl (propanoyl), butyryl (butanoyl), valeryl (pentanoyl), and hexanoyl groups; and aromatic acyl (aroyl) groups such as benzoyl and toluoyl groups.

Examples of the alkyl groups represented by $R^2$ and $R^4$ include methyl, ethyl, n-propyl, isopropyl, n-butyl, isobutyl, sec-butyl, tert-butyl, n-pentyl, isopentyl, n-hexyl, isohexyl, 3-methylpentyl, 2-methylpentyl, 1,2-dimethylbutyl, cyclopropyl, cyclopentyl, and cyclohexyl groups.

Examples of the aralkyl groups represented by $R^2$ and $R^4$ include benzyl and phenylethyl (phenethyl) groups.

Examples of the alkenyl groups represented by $R^2$ and $R^4$ include vinyl, 1-propenyl, 2-propenyl, isopropenyl, 3-butenyl, 2-butenyl, 1-butenyl, 1-methyl-2-propenyl, 1-methyl-1-propenyl, 1-ethyl-1-ethenyl, 2-methyl-2-propenyl, 2-methyl-1-propenyl, 3-methyl-2-butenyl, and 4-pentenyl groups.

Examples of the aryl groups represented by $R^2$ and $R^4$ include phenyl, 1-naphthyl, and 2-naphthyl groups.

Examples of the substituents in $R^1$, $R^2$, $R^3$, and $R^4$ include: alkyl groups having 1 to 6 carbon atoms; alkoxy groups having 1 to 6 carbon atoms such as methoxy, ethoxy, n-propoxy, isopropoxy, n-butoxy, isobutoxy, sec-butoxy, tert-butoxy, n-pentyloxy, isopentyloxy, n-hexyloxy, cyclopropyloxy, cyclobutyloxy, cyclopentyloxy, and cyclohexyloxy groups; alkoxycarbonyl groups having 1 to 6 carbon atoms such as methoxycarbonyl, ethoxycarbonyl, n-propoxycarbonyl, isopropoxycarbonyl, n-butoxycarbonyl, isobutoxycarbonyl, sec-butoxycarbonyl, tert-butoxycarbonyl, n-pentyloxycarbonyl, isopentyloxycarbonyl, cyclopropyloxycarbonyl, cyclobutyloxycarbonyl, and cyclopentyloxycarbonyl groups; aromatic hydrocarbon groups such as phenyl, tolyl, and naphthyl groups; halogen atoms such as fluorine, chlorine, bromine, and iodine atoms; acyl groups having 1 to 6 carbon atoms; aralkyl groups having 7 to 10 carbon atoms; aralkyloxy groups having 7 to 10 carbon atoms; alkylamino groups having 1 to 6 carbon atoms; and dialkylamino groups having an alkyl group having 1 to 6 carbon atoms.

It is preferable for $R^1$ and $R^3$ to be a halogen atom, $NO_3$, an optionally substituted alkoxy group having 1 to 6 carbon atoms, an optionally substituted acyloxy group having 2 to 6 carbon atoms, an optionally substituted β-diketonato group having 5 to 10 carbon atoms, or a diacylmethyl group having an optionally substituted acyl group having 1 to 6 carbon atoms, and it is more preferable for $R^1$ and $R^3$ to be an optionally substituted alkoxy group having 1 to 6 carbon atoms.

It is preferable for $R^2$ and $R^4$ to be an optionally substituted alkyl group having 1 to 6 carbon atoms. It is preferable for k in the formula [I] to be 3.

It is preferable for $M^1$ to be an atom of a metal belonging to Group 4 of the periodic table, and it is more preferable for $M^1$ to be titanium or zirconium. When $M^1$ is an atom of a metal belonging to Group 4 of the periodic table, m in the formula [II] is preferably 4.

Boron and silicon are categorized herein as metals, although they may be classified as semimetals in other contexts.

Examples of the compound (Ea) include aluminum chloride, aluminum nitrate, aluminum acetate, tris(2,4-pentanedionato)aluminum, trim ethoxyaluminum, triethoxyaluminum, tri-n-propoxyaluminum, triisopropoxyaluminum, tri-n-butoxyaluminum, tri-sec-butoxyaluminum, and tri-tert-butoxyaluminum. Among these, triisopropoxyaluminum and tri-sec-butoxyaluminum are preferred. A combination of two or more compounds (Ea) may be used as the compound (E).

Examples of the compound (Eb) include: titanium compounds such as tetrakis(2,4-pentanedionato)titanium, tetramethoxytitanium, tetraethoxytitanium, tetraisopropoxytitanium, tetra-n-butoxytitanium, and tetrakis(2-ethylhexoxy)titanium; and zirconium compounds such as tetrakis(2,4-pentanedionato)zirconium, tetra-n-propoxyzirconium, and tetra-n-butoxyzirconium. These may be used alone, or a combination of two or more thereof may be used as the compound (Eb).

The proportion of the compound (Ea) in the total amount of the compound (E) is not particularly limited as long as the effect of the present invention is obtained. For example, the proportion of the compound (e.g., the compound (Eb)) other than the compound (Ea) in the total amount of the compound (E) is preferably 20 mol % or less, more preferably 10 mol % or less, and even more preferably 5 mol % or less, and may be 0 mol %.

The compound (E) is hydrolyzed, so that at least some of the hydrolyzable characteristic groups of the compound (E) are converted to hydroxy groups. The hydrolysate is then condensed to form a compound in which the metal atoms (M) are linked together via an oxygen atom (O). The repetition of this condensation results in the formation of a compound that can be regarded substantially as a metal oxide. The thus formed metal oxide (Aa), in general, has hydroxy groups present on its surface.

A compound is categorized herein as the metal oxide (Aa) when the ratio, [the number of moles of the oxygen atoms (O) bonded only to the metal atoms (M)]/[the number of moles of the metal atoms (M)], is 0.8 or more in the compound. The "oxygen atom (O) bonded only to the metal atom (M)", as defined herein, refers to the oxygen atom (O) in the structure represented by M-O-M, and does not include an oxygen atom that is bonded to both the metal atom (M) and hydrogen atom (H) as is the case for the oxygen atom (O) in the structure represented by M-O—H. The above ratio in the metal oxide (Aa) is preferably 0.9 or more, more preferably 1.0 or more, and even more preferably 1.1 or more. The upper limit of this ratio is not particularly defined. When the valence of the metal atom (M) is denoted by n, the upper limit is typically expressed as n/2.

In order for the hydrolytic condensation to take place, it is important that the compound (E) has hydrolyzable characteristic groups. When there are no such groups bonded, hydrolytic condensation reaction does not occur or proceeds very slowly, which makes difficult the preparation of the metal oxide (Aa) intended.

The hydrolytic condensate of the compound (E) may be produced, for example, from a particular starting material by a technique employed in known sol-gel processes. As the starting material there can be used at least one selected from the group consisting of the compound (E), a partial hydrolysate of the compound (E), a complete hydrolysate of the compound (E), a compound formed by partial hydrolytic condensation of the compound (E), and a compound formed by condensation of a part of a complete hydrolysate of the compound (E).

The metal oxide (Aa) to be mixed with an inorganic phosphorus compound (BI)-containing material (the inorganic phosphorus compound (BI) itself or a composition containing the inorganic phosphorus compound (BI)) is preferably substantially free of phosphorus atoms.

[Phosphorus Compound (B)]

The phosphorus compound (B) has a functional group containing a phosphorus atom. The phosphorus compound (B) includes the inorganic phosphorus compound (BI) and/or organic phosphorus compound (BO), and is preferably the inorganic phosphorus compound (BI).

[Inorganic Phosphorus Compound (BI)]

The inorganic phosphorus compound (BI) has a moiety capable of reacting with the metal oxide (Aa) and typically has two or more such moieties. It is preferable for the inorganic phosphorus compound (BI) to be a compound having 2 to 20 such moieties (atomic groups or functional groups). Examples of such moieties include a moiety capable of undergoing a condensation reaction with a functional group (e.g., hydroxy group) present on the surface of the metal oxide (Aa). Examples of such a moiety include a halogen atom bonded directly to a phosphorus atom and an oxygen atom bonded directly to a phosphorus atom. In general, the functional group (e.g., hydroxy group) present on the surface of the metal oxide (Aa) is bonded to the metal atom (M) constituting the metal oxide (Aa).

Examples of the inorganic phosphorus compound (BI) include: phosphorus oxoacids such as phosphoric acid, diphosphoric acid, triphosphoric acid, polyphosphoric acid formed by condensation of 4 or more molecules of phosphoric acid, phosphorous acid, phosphonic acid, phosphonous acid, phosphinic acid, and phosphinous acid; salts of these oxoacids (e.g., sodium phosphate); and derivatives of these oxoacids (e.g., halides such as phosphoryl chloride and dehydration products such as phosphorus pentoxide).

These inorganic phosphorus compounds (BI) may be used alone or in combination with one another. Among these inorganic phosphorus compounds (BI), phosphoric acid is preferably used alone or in combination with another inorganic phosphorus compound (BI). The use of phosphoric acid improves the stability of the coating liquid (S) described later and the gas barrier properties of the resulting multilayer structure. When phosphoric acid is used in combination with another inorganic phosphorus compound (BI), phosphoric acid preferably makes up 50 mol % or more of the total inorganic phosphorus compounds (BI).

[Organic Phosphorus Compound (BO)]

Examples of the phosphorus atom-containing functional group in the organic phosphorus compound (BO) include a phosphoric acid group, a phosphorous acid group, a phosphonic acid group, a phosphonous acid group, a phosphinic acid group, a phosphinous acid group, and functional groups derived from these groups (e.g., salts, (partial) esters, halides (such as chloride), and dehydration products). Among these, a phosphoric acid group and a phosphonic acid group are preferred, and a phosphonic acid group is more preferred.

It is preferable for the organic phosphorus compound (BO) to be a polymer (BOa) having the phosphorus atom-containing functional group. Examples of the polymer (BOa) include: polymers of phosphono(meth)acrylic acid ester compounds such as 6-[(2-phosphonoacetyl)oxy]hexyl acrylate, 2-phosphonooxyethyl methacrylate, phosphonomethyl methacrylate, 11-phosphonoundecyl methacrylate, and 1,1-diphosphonoethyl methacrylate; polymers of vinylphosphonic acid compounds such as vinylphosphonic acid, 2-propene-1-phosphonic acid, 4-vinylbenzylphosphonic acid, and 4-vinylphenylphosphonic acid; polymers of vinylphosphinic acid compounds such as vinylphosphinic acid and 4-vinylbenzylphosphinic acid; and phosphorylated starch. The polymer (BOa) may be a homopolymer of a monomer having at least one phosphorus atom-containing functional group or may be a copolymer of two or more monomers. Alternatively, a combination of two or more polymers each formed from a single monomer may be used as the polymer (BOa). In particular, a polymer of a phosphono(meth)acrylic acid ester compound and a polymer of a vinylphosphonic acid compound are preferred, and a polymer of a vinylphosphonic acid compound is more preferred. That is, poly(vinylphosphonic acid) is preferred as the polymer (BOa). The polymer (BOa) can be obtained also by homopolymerization or copolymerization of a vinylphosphonic acid derivative such as a vinylphosphonic acid halide or vinylphosphonic acid ester, followed by hydrolysis.

Alternatively, the polymer (BOa) may be a copolymer of a monomer having at least one phosphorus atom-containing functional group and another vinyl monomer. Examples of the other vinyl monomer copolymerizable with the monomer having the phosphorus atom-containing functional group include (meth)acrylic acid, (meth)acrylic acid esters, (meth)acrylonitrile, styrene, nuclear-substituted styrenes, alkyl vinyl ethers, alkyl vinyl esters, perfluoroalkyl vinyl ethers, perfluoroalkyl vinyl esters, maleic acid, maleic anhydride, fumaric acid, itaconic acid, maleimide, and phenylmaleimide. Among these, (meth)acrylic acid esters, acrylonitrile, styrene, maleimide, and phenylmaleimide are preferred.

In order to obtain a multilayer structure that has better bending resistance, the proportion of the structural units derived from the monomer having the phosphorus atom-containing functional group in the total structural units of the polymer (BOa) is preferably 10 mol % or more, more preferably 20 mol % or more, even more preferably 40 mol % or more, and particularly preferably 70 mol % or more, and may be 100 mol %.

The molecular weight of the polymer (BOa) is not particularly limited, but is preferably such that the number-average molecular weight is in the range of 1,000 to 100,000. When the number-average molecular weight is in this range, a high level of improving effect of stacking of the layer (Y) on bending resistance can be achieved and, in the case of using a coating liquid (T) described later, a high level of viscosity stability of the coating liquid (T) can also be achieved.

When the layer (Y) of the multilayer structure contains the inorganic phosphorus compound (BI) and the organic phosphorus compound (BO), the ratio $W_{BO}/W_{BI}$ between the weight $W_{BI}$ of the inorganic phosphorus compound (BI) and the weight $W_{BO}$ of the organic phosphorus compound (BO) in the layer (Y) preferably satisfies a relationship of $0.01/99.99 \leq W_{BO}/W_{BI} < 6.00/94.00$. In terms of good barrier performance, the ratio $W_{BO}/W_{BI}$ more preferably satisfies a relationship of $0.10/99.90 \leq W_{BO}/W_{BI} < 4.50/95.50$, even more preferably satisfies a relationship of $0.20/99.80 \leq W_{BO}/W_{BI} < 4.00/96.00$, and particularly preferably satisfies a relationship of $0.50/99.50 \leq W_{BO}/W_{BI} < 3.50/96.50$. That is, it is preferable to use the compounds in such proportions that the proportion of $W_{BO}$ be low, in particular 0.01 or more and less than 6.00, while the proportion of $W_{BI}$ be high, in particular more than 94.00 and 99.99 or less. When the inorganic phosphorus compound (BI) and/or organic phosphorus compound (BO) has undergone a reaction in the layer (Y), a moiety derived from the inorganic phosphorus compound (BI) and/or organic phosphorus compound (BO) in the reaction product is regarded as the inorganic phosphorus compound (BI) and/or organic phosphorus compound (BO). In this case, the weight of the inorganic phosphorus compound (BI) and/or organic phosphorus compound (BO) used in the formation of the reaction product (the weight of the inorganic phosphorus compound (BI) and/or organic phosphorus compound (BO) that has yet to undergo the reaction) is included in the weight of the inorganic phosphorus compound (BI) and/or organic phosphorus compound (BO) in the layer (Y).

[Reaction product (D)]

The reaction product (D) is formed by a reaction between the aluminum-containing compound (A) and the phosphorus compound (B). A compound formed by a reaction among the aluminum-containing compound (A), the phosphorus compound (B), and another compound is also categorized as the reaction product (D). The reaction product (D) is preferably a reaction product (Da) formed by a reaction between the aluminum-containing metal oxide (Aa) and the phosphorus compound (B), a reaction product (Db) formed by a reaction between the aluminum-containing compound (A) and the inorganic phosphorus compound (BI), or a reaction product (Dc) formed by a reaction between the aluminum-containing metal oxide (Aa) and the inorganic phosphorus compound (BI). More preferred is the reaction product (Dc) formed by a reaction between the aluminum-containing metal oxide (Aa) and the inorganic phosphorus compound (BI).

In an infrared absorption spectrum of the layer (Y), a maximum absorption wavenumber in the region from 800 to 1,400 cm$^{-1}$ is preferably 1,080 to 1,130 cm$^{-1}$. In the process in which the metal oxide (Aa) and the inorganic phosphorus compound (BI) react to form the reaction product (Dc), for example, a metal atom (M) derived from the metal oxide (Aa) and a phosphorus atom (P) derived from the inorganic phosphorus compound (BI) are linked via an oxygen atom (O) to form a bond represented by M-O—P. As a result, a characteristic absorption band attributed to this bond appears in an infrared absorption spectrum of the reaction product (D). A study by the present inventors has revealed that the resulting multilayer structure exhibits good gas barrier properties when the characteristic absorption band attributed to the M-O—P bond is observed in the region from 1,080 to 1,130 cm$^{-1}$. It has been found that the resulting multilayer structure exhibits much better gas barrier properties particularly when the characteristic absorption band corresponds to the strongest absorption in the region from 800 to 1,400 $cm^{-1}$ where absorptions attributed to bonds between various atoms and oxygen atoms are generally observed.

By contrast, if a metal compound such as a metal alkoxide or metal salt and the inorganic phosphorus compound (BI) are first mixed together and the mixture is then subjected to hydrolytic condensation, the resulting product is a composite material in which the metal atoms derived from the metal compound and the phosphorus atoms derived from the inorganic phosphorus compound (BI) have been almost homogeneously mixed and reacted. In this case, in an infrared absorption spectrum of the composite material, the maximum absorption wavenumber in the region from 800 to 1,400 $cm^{-1}$ falls outside the range of 1,080 to 1,130 $cm^{-1}$.

In the infrared absorption spectrum of the layer (Y), the width at half maximum of the maximum absorption band in the region from 800 to 1,400 $cm^{-1}$ is preferably 200 $cm^{-1}$ or less, more preferably 150 $cm^{-1}$ or less, even more preferably 100 $cm^{-1}$ or less, and particularly preferably 50 $cm^{-1}$ or less, in terms of the gas barrier properties of the resulting multilayer structure.

The infrared absorption spectrum of the layer (Y) can be measured by the method described in "EXAMPLES" below. If the measurement is not possible by the method described in "EXAMPLES", the measurement may be conducted by another method, examples of which include, but are not limited to: reflection spectroscopy such as reflection absorption spectroscopy, external reflection spectroscopy, or attenuated total reflection spectroscopy; and transmission spectroscopy such as Nujol method or pellet method performed on the layer (Y) scraped from the multilayer structure.

The layer (Y) may partially contain the metal oxide (Aa) and/or inorganic phosphorus compound (BI) that remains uninvolved in any reaction.

In the layer (Y), the molar ratio between the metal atoms constituting the metal oxide (Aa) and the phosphorus atoms derived from the inorganic phosphorus compound (BI), as expressed by [Metal atoms constituting metal oxide (Aa)]: [Phosphorus atoms derived from inorganic phosphorus compound (BI)], is preferably 1.0:1.0 to 3.6:1.0 and more preferably 1.1:1.0 to 3.0:1.0. If the molar ratio falls outside such a range, the gas barrier performance deteriorates. The molar ratio in the layer (Y) can be controlled by adjusting the mixing ratio between the metal oxide (Aa) and the inorganic phosphorus compound (BI) in a coating liquid for forming the layer (Y). The molar ratio in the layer (Y) is typically equal to that in the coating liquid.

[Inorganic Deposited Layer, Compound (Ac), and Compound (Ad)]

The multilayer structure may further include an inorganic deposited layer. The inorganic deposited layer can be formed by vapor deposition of an inorganic substance. Examples of the inorganic substance include metals (such as aluminum), metal oxides (such as silicon oxide and aluminum oxide), metal nitrides (such as silicon nitride), metal oxynitrides (such as silicon oxynitride), and metal carbonitrides (such as silicon carbonitride). Among these, aluminum oxide, silicon oxide, magnesium oxide, and silicon nitride are preferred, since an inorganic deposited layer formed of any of these substances has good barrier properties against oxygen or water vapor. The layer (Y) in the multilayer structure of the present invention may include an inorganic deposited layer containing aluminum. For example, the layer (Y) may include a deposited layer of aluminum (Ac) and/or a deposited layer of aluminum oxide (Ad).

The method for forming the inorganic deposited layer is not particularly limited, and available methods include: physical vapor deposition processes such as vacuum vapor deposition (e.g., resistive heating vapor deposition, electron beam vapor deposition, and molecular beam epitaxy), sputtering, and ion plating; and chemical vapor deposition processes such as thermal chemical vapor deposition (e.g., catalytic chemical vapor deposition), photochemical vapor deposition, plasma chemical vapor deposition (e.g., capacitively coupled plasma process, inductively coupled plasma process, surface wave plasma process, electron cyclotron resonance plasma process, and dual magnetron process), atomic layer deposition, and organometallic vapor deposition.

The thickness of the inorganic deposited layer is preferably 0.002 to 0.5 μm, more preferably 0.005 to 0.2 μm, and even more preferably 0.01 to 0.1 μm, although the specific preferred thickness depends on the type of the component of the inorganic deposited layer. A thickness at which good barrier properties or mechanical properties of the multilayer structure are achieved can be selected within the above range. If the thickness of the inorganic deposited layer is less than 0.002 μm, the inorganic deposited layer tends to have a low ability to repeatedly exhibit the bather properties against oxygen or water vapor, and the inorganic deposited layer may fail to exhibit sufficient barrier properties. If the thickness of the inorganic deposited layer is more than 0.5 μm, the barrier properties of the inorganic deposited layer are likely to deteriorate when the multilayer structure is pulled or bent.

The layer (Y) included in the multilayer structure of the present invention may consist only of the reaction product (D) of the aluminum-containing compound (A) and the phosphorus compound (B), may consist only of the reaction product (Da) of the aluminum-containing metal oxide (Aa) and the phosphorus compound (B), may consist only of the reaction product (Db) of the aluminum-containing compound (A) and the inorganic phosphorus compound (BI), may consist only of the reaction product (Dc) of the aluminum-containing metal oxide (Aa) and the inorganic phosphorus compound (BI), or may further contain an additional component. In all of the above aspects, the layer (Y) may further contain the organic phosphorus compound (BO). Examples of the additional component that may be contained in the layer (Y) include: metal salts of inorganic acids such as a metal carbonate, a metal hydrochloride, a metal nitrate, a metal hydrogen carbonate, a metal sulfate, a metal hydrogen sulfate, and a metal borate; metal salts of organic acids such as a metal oxalate, a metal acetate, a metal tartrate, and a metal stearate; metal complexes such as a cydopentadienyl metal complex (e.g., titanocene) and a cyanometal complex (e.g., Prussian blue); layered clay compounds; crosslinkers; a polymer compound (F) other than the organic phosphorus compound (BO); plasticizers; antioxidants; ultraviolet absorbers; and flame retardants. The content of the additional component in the layer (Y) of the multilayer structure is preferably 50 wt % or less, more preferably 20 wt % or less, even more preferably 10 wt % or less, and particularly preferably 5 wt % or less, and may be 0 wt % (which means that the additional component is not contained).

[Polymer Compound (F)]

The polymer compound (F) may be, for example, a polymer (Fa) having at least one functional group selected from the group consisting of an ether bond, a carbonyl group, a hydroxy group, a carboxyl group, a carboxylic anhydride group, and a salt of a carboxyl group.

Examples of the polymer (Fa) include: polyethylene glycol; polyketone; polyvinyl alcohol polymers such as polyvinyl alcohol, modified polyvinyl alcohol containing 1 to 50 mol % of α-olefin units having 4 or less carbon atoms, and polyvinyl acetal (e.g., polyvinyl butyral); polysaccharides such as cellulose, starch, and cyclodextrin; (meth)acrylic polymers such as polyhydroxyethyl (meth)acrylate, poly(meth)acrylic acid, and ethylene-acrylic acid copolymer; and maleic polymers such as a hydrolysate of ethylene-maleic anhydride copolymer, a hydrolysate of styrene-maleic anhydride copolymer, and a hydrolysate of isobutylene-maleic anhydride alternating copolymer. To allow the layer (Y) to have high transparency, it is preferable not to incorporate any of the polyvinyl alcohol polymers.

The polymer (Fa) may be a homopolymer of a monomer having a polymerizable group (e.g., vinyl acetate or acrylic acid), may be a copolymer of two or more monomers, or may be a copolymer of a monomer having a hydroxy group and/or carboxyl group and a monomer having none of these groups. A combination of two or more polymers (Fa) may be used as the polymer (Fa).

The molecular weight of the polymer (Fa) is not particularly limited. In order to obtain a multilayer structure that has better gas barrier properties and higher mechanical strength, the weight-average molecular weight of the polymer (Fa) is preferably 5,000 or more, more preferably 8,000 or more, and even more preferably 10,000 or more. The upper limit of the weight-average molecular weight of the polymer (Fa) is not particularly defined, and the weight-average molecular weight is, for example, 1,500,000 or less.

In terms of allowing the multilayer structure to have good appearance, the content of the polymer (Fa) in the layer (Y) is preferably 85 wt % or less, more preferably 50 wt % or less, even more preferably 20 wt % or less, and particularly preferably 10 wt % or less, with respect to the weight of the layer (Y) (defined as 100 wt %). The polymer (Fa) may or may not react with another component in the layer (Y).

The thickness of the layer (Y) (or, for a multilayer structure including two or more layers (Y), the total thickness of the layers (Y)), is preferably 0.05 to 4.0 μm and more preferably 0.1 to 2.0 μm. Thinning the layer (Y) provides a reduction in the dimensional change of the multilayer structure during a process such as printing or lamination. Thinning the layer (Y) also provides an increase in the flexibility of the multilayer structure, thus making it possible to allow the multilayer structure to have mechanical characteristics close to mechanical characteristics intrinsic to the base. When the multilayer structure of the present invention includes two or more layers (Y), the thickness of each layer (Y) is preferably 0.05 μm or more in terms of gas barrier properties. The thickness of the layer (Y) can be controlled depending on the concentration of the later-described coating liquid (S) used for formation of the layer (Y) or the method for applying the liquid (S).

The thickness of the layer (Y) can be measured by observing a cross-section of the multilayer structure with a scanning electron microscope or transmission electron microscope.

[Method for Producing Multilayer Structure]

The features described for the multilayer structure of the present invention can be applied to the production method of the present invention and may not be described repeatedly. The features described for the production method of the present invention can be applied to the multilayer structure of the present invention.

An example of the method for producing a multilayer structure according to the present invention is a production method including the steps of: (I) applying a coating liquid (S) (first coating liquid) containing an aluminum-containing compound (A), a phosphorus compound (B), and a solvent onto a base (X) to form a precursor layer of a layer (Y), the precursor layer containing a reaction product (D) precursor; and (II) heat-treating the precursor layer of the layer (Y) at a temperature of 140° C. or higher to form the layer (Y) containing a reaction product (D). In the production method, the coating liquid (S) used in the step (I) may contain an organic phosphorus compound (BO). When the coating liquid (S) used in the step (I) does not contain the organic phosphorus compound (BO), the method may further include the step (I') of applying a coating liquid (T) containing the organic phosphorus compound (BO) to a surface of the precursor layer obtained in the step (I). The compound (A), the inorganic phosphorus compound (BI), the organic phosphorus compound (BO), and the weight ratio between them are as previously described, and repeated explanation will be omitted in the following description of the production method.

[Step (I)]

In the step (I), the coating liquid (S) (first coating liquid) containing the aluminum-containing compound (A), the phosphorus compound (B), and a solvent is applied onto the base (X) to form a precursor layer of the layer (Y) on the base (X), the precursor layer containing a reaction product (D) precursor. The coating liquid (S) is obtained by mixing the aluminum-containing compound (A), the phosphorus compound (B), and the solvent. When the layer (Y) is to include a deposited layer of aluminum (Ac) or a deposited layer of aluminum oxide (Ad), the deposited layer can be formed by any of the common vapor deposition processes mentioned above. The following will describe a preferred embodiment employing the metal oxide (Aa), the inorganic phosphorus compound (BI), and the solvent.

In the preferred embodiment, the coating liquid (S) can be prepared by mixing the metal oxide (Aa) and the inorganic phosphorus compound (BI) in the solvent to cause a reaction. Specifically, the coating liquid (S) can be prepared, for example, by a method in which a dispersion of the metal oxide (Aa) and a solution containing the inorganic phosphorus compound (BI) are mixed or by a method in which the inorganic phosphorus compound (BI) is added to and mixed with a dispersion of the metal oxide (Aa). The temperature during the mixing is preferably 50° C. or lower, more preferably 30° C. or lower, and even more preferably 20° C. or lower. The coating liquid (S) may contain another compound (e.g., the polymer compound (F), preferably other than polyvinyl alcohol polymers), and may contain, if desired, at least one acid compound (Q) selected from the group consisting of acetic acid, hydrochloric acid, nitric acid, trifluoroacetic acid, and trichloroacetic acid.

The dispersion of the metal oxide (Aa) can be prepared, for example, by mixing the compound (E), water, and optionally an acid catalyst or organic solvent and allowing the compound (E) to undergo condensation or hydrolytic condensation according to procedures employed in known sol-gel processes. When the dispersion of the metal oxide (Aa) is obtained by condensation or hydrolytic condensation of the compound (E), the dispersion obtained may, if desired, be subjected to a certain process (such as deflocculation in the presence of the acid compound (Q)). The solvent used is preferably, but not limited to, an alcohol such as methanol, ethanol, or isopropanol, water, or a mixed solvent thereof.

The solution containing the inorganic phosphorus compound (BI) can be prepared by dissolving the inorganic phosphorus compound (BI) in a solvent. The solvent can be selected depending on the type of the inorganic phosphorus compound (BI), and preferably contains water. The solvent may contain an organic solvent (e.g., an alcohol such as methanol) as long as the organic solvent does not hinder the dissolution of the inorganic phosphorus compound (BI).

The solids concentration in the coating liquid (S) is preferably 1 to 20 wt %, more preferably 2 to 15 wt %, and even more preferably 3 to 10 wt %, in terms of the storage stability of the coating liquid and the quality of application of the coating liquid onto the base (X). The solids concentration can be determined, for example, by distilling off the solvent from the coating liquid (S) and dividing the weight of the remaining solids by the initial weight of the coating liquid (S) yet to be subjected to the distillation.

The viscosity of the coating liquid (S) is preferably 3,000 mPa·s or less, more preferably 2,500 mPa·s or less, and even more preferably 2,000 mPa·s or less, as measured with a Brookfield rotational viscometer (SB-type viscometer: rotor No. 3, rotational speed=60 rpm) at a temperature at which the coating liquid (S) is applied. Adjusting the viscosity to 3,000 mPa·s or less improves the leveling of the coating liquid (S), thus allowing the resulting multilayer structure to have better appearance. The viscosity of the coating liquid (S) is preferably 50 mPa·s or more, more preferably 100 mPa·s or more, and even more preferably 200 mPa·s or more.

To allow the reaction product (D) to have a predetermined average particle diameter, the molar ratio between aluminum atoms and phosphorus atoms in the coating liquid (S), as expressed by aluminum atoms:phosphorus atoms, is preferably 1.01:1.00 to 1.50:1.00 and more preferably 1.05:1.00 to 1.45:1.00. The molar ratio between aluminum atoms and phosphorus atoms can be determined by fluorescent X-ray analysis of a solid obtained by drying the coating liquid (S).

The coating liquid (S) may be applied directly onto at least one surface of the base (X) or applied onto the base (X) with an additional layer (J) interposed therebetween. An adhesive layer (G) may be formed on a surface of the base (X) by treating the surface of the base (X) with a known anchor coating agent or applying a known adhesive onto the surface of the base (X) before application of the coating liquid (S).

The method for application of the coating liquid (S) is not particularly limited, and any known method can be employed. Examples of the method for application include casting, dipping, roll coating, gravure coating, screen printing, reverse coating, spray coating, kiss coating, die coating, metering bar coating, chamber doctor-using coating, curtain coating, and bar coating.

In the step (I), the precursor layer of the layer (Y) is formed typically by removing the solvent from the coating liquid (S). The method for removing the solvent is not particularly limited, and any known drying method can be employed. Examples of the drying method include hot air drying, hot roll contact drying, infrared heating, and microwave heating. To allow the resulting multilayer structure to maintain good gas barrier properties after retorting, it is important that, after drying, the solvent content and the average particle diameter of the reaction product (D) precursor are within predetermined ranges.

The solvent content of the dried precursor layer of the layer (Y) is preferably 0.4 wt % or less and, in terms of achieving good barrier performance even after retorting under harsh conditions, is more preferably 0.3 wt % or less. When the solvent content of the dried precursor layer of the layer (Y) is in such a range, the particle diameter of the reaction product (D) precursor, and therefore the average particle diameter of the reaction product (D) in the layer (Y) to be obtained by the subsequent heat treatment (step (II)), can be made smaller so that higher barrier performance is achieved. The lower limit of the solvent content is not particularly defined. In general, it is preferable that the solvent content be 0.01 wt % or more, in terms of production cost. The method for measuring the solvent content is as described in "EXAMPLES" below.

The average particle diameter of the reaction product (D) precursor in the dried precursor layer of the layer (Y) is preferably less than 5 nm and, in terms of achieving high barrier performance even after retorting under harsh conditions, is more preferably less than 4 nm, and even more preferably less than 3 nm. When the average particle diameter of the reaction product (D) precursor in the dried precursor layer of the layer (Y) is in such a range, the average particle diameter of the reaction product (D) in the resulting layer (Y) becomes smaller so that higher barrier performance is achieved. The lower limit of the average particle diameter of the reaction product (D) precursor is not particularly defined, and the average particle diameter may be, for example, 0.1 nm or more or 1 nm or more. The method for measuring the average particle diameter of the reaction product (D) precursor is as described in "EXAMPLES" below.

Specifically, when the solvent content and the average particle diameter of the reaction product (D) precursor fall within the above ranges, the average particle diameter of the reaction product (D) contained in the layer (Y) of the resulting multilayer structure can be 50 nm or less, which results in higher barrier performance.

In an infrared absorption spectrum of the layer (Y) precursor, a ratio $A_R/A_P$ of a maximum $A_R$ of absorbance in the region from 1,080 to 1,130 $cm^{-1}$ to a maximum $A_P$ of absorbance in the region from 850 to 950 $cm^{-1}$ is preferably 2.0 or less and more preferably 1.4 or less. The maximum $A_R$ of absorbance in the region from 1,080 to 1,130 $cm^{-1}$ is attributed to a M-O-P bond as previously described, while the maximum $A_P$ of absorbance in the region from 850 to 950 $cm^{-1}$ is attributed to a M-O-M bond. That is, the ratio $A_R/A_P$ can be considered a measure indicating the degree of conversion of the aluminum-containing metal oxide (Aa) to the reaction product (D). In the present invention, it is considered effective, in order to obtain a multilayer structure that has good barrier performance, to control the degree of conversion of the metal oxide (Aa) to the reaction product (D) at or below a certain level in the layer (Y) precursor having undergone the drying step. Thus, if the ratio $A_R/A_P$ is beyond the limit indicated above, the resulting multilayer structure may have insufficient barrier performance.

The drying temperature is preferably equal to or lower than the onset temperature of fluidization of the base (X). The temperature employed for drying the applied coating liquid (S) may be, for example, around 80 to 180° C. To control the solvent content and the average particle diameter of the reaction product (D) precursor to the desired ranges, the temperature employed for drying the applied coating liquid (S) is preferably lower than 140° C., more preferably 60° C. or higher and lower than 140° C., even more preferably 70° C. or higher and lower than 130° C., and particularly preferably 80° C. or higher and lower than 120° C. The drying time is preferably, but not limited to, 1 second or more and less than 1 hour, more preferably 5 seconds or more and less than 15 minutes, and even more preferably 5 seconds or more and less than 300 seconds. In particular, when the drying temperature is 100° C. or higher (for example, 100 to 140° C.), the drying time is preferably 1 second or more and less than 4 minutes, more preferably 5 seconds or more and less than 4 minutes, and even more preferably 5 seconds or more and less than 3 minutes. When the drying temperature is lower than 100° C. (for example, 60 to 99° C.), the drying time is preferably 3 minutes or more and less than 1 hour, more preferably 6 minutes or more and less than 30 minutes, and even more preferably 8 minutes or more and less than 25 minutes.

[Step (II)]

In the step (II), the precursor layer of the layer (Y), which has been formed in the step (I), is heat-treated at a temperature of 140° C. or higher to form the layer (Y). In the present invention, it is important to heat-treat the layer (Y) precursor having the predetermined solvent content and average particle diameter described above at a temperature of 140° C. or higher in order to achieve higher barrier performance. The heat treatment temperature in the step (II) is preferably higher than the drying temperature in the step (I).

In the step (II), the reaction of formation of the reaction product (D) takes place. To allow the reaction to take place to a sufficient extent, the heat treatment temperature is 140° C. or higher, preferably 170° C. or higher, more preferably 180° C. or higher, and even more preferably 190° C. or higher. A lowered heat treatment temperature increases the time required to achieve a sufficient reaction rate, thereby causing a reduction in production efficiency. The heat treatment temperature depends on, for example, the type of the base (X) and thus is not particularly limited. The heat treatment temperature may be 270° C. or lower. For example, when a thermoplastic resin film made of polyamide resin is used as the base (X), the heat treatment temperature is preferably 270° C. or lower. When a thermoplastic resin film made of polyester resin is used as the base (X), the heat treatment temperature is preferably 240° C. or lower. The heat treatment may be carried out, for example, in an air atmosphere, nitrogen atmosphere, or argon atmosphere. The heat treatment time is preferably 1 second to 1 hour, more preferably 1 second to 15 minutes, and even more preferably 5 to 300 seconds.

To control the solvent content and the average particle diameter of the reaction product (D) precursor to the desired ranges, the heat treatment is preferably carried out in two or more stages with varying treatment temperatures. That is, the step (II) preferably includes a first heat treatment step (II-1) and a second heat treatment step (II-2). When the heat treatment is carried out in two or more stages, the temperature of the heat treatment at the second stage (which will hereinafter be referred to as "second heat treatment") is preferably higher than the temperature of the heat treatment at the first stage (which will hereinafter be referred to as "first heat treatment"). The temperature of the second heat treatment is more preferably 15° C. or more higher, even more preferably 25° C. or more higher, and particularly preferably 35° C. or more higher, than the temperature of the first heat treatment.

To obtain a multilayer structure having good properties, the heat treatment temperature in the step (II) (or the temperature of the first heat treatment when the heat treatment consists of two or more stages) is preferably 30° C. or more higher, more preferably 50° C. or more higher, even more preferably 55° C. or more higher, and particularly preferably 60° C. or more higher, than the drying temperature in the step (I).

When the heat treatment in the step (II) is carried out in two or more stages, it is preferable that the temperature of the second heat treatment be higher than the temperature of the first heat treatment, the temperature of the first heat treatment be 140° C. or higher and lower than 200° C., and the temperature of the second heat treatment be 180° C. or higher and 270° C. or lower. It is more preferable that the temperature of the second heat treatment be 15° C. or more higher than the temperature of the first heat treatment, the temperature of the first heat treatment be 140° C. or higher and lower than 200° C., and the temperature of the second heat treatment be 180° C. or higher and 270° C. or lower. It is even more preferable that the temperature of the second heat treatment be 25° C. or more higher than the temperature of the first heat treatment, the temperature of the first heat treatment be 140° C. or higher and lower than 200° C., and the temperature of the second heat treatment be 180° C. or higher and 270° C. or lower. In particular, when the heat treatment temperatures are 200° C. or higher, the heat treatment times are preferably 0.1 seconds to 10 minutes, more preferably 0.5 seconds to 15 minutes, and even more preferably 1 second to 3 minutes. When the heat treatment temperatures are lower than 200° C., the heat treatment times are preferably 1 second to 15 minutes, more preferably 5 seconds to 10 minutes, and even more preferably 10 seconds to 5 minutes.

[Step (I')]

When the organic phosphorus compound (BO) is used in the production method, the production method may include the step (I') of applying a coating liquid (T) (second coating liquid) that is a mixture of the organic phosphorus compound (BO) and a solvent onto the layer (Y) obtained in the step (II). The coating liquid (T) can be prepared by mixing the organic phosphorus compound (BO) and a solvent. The solvent used in the coating liquid (T) can be selected as appropriate depending on the type of the organic phosphorus compound (BO), and is preferably, but not limited to, an alcohol such as methanol, ethanol, or isopropanol, water, or a mixed solvent thereof. It is preferable to perform the step (I') to apply the coating liquid (T) onto the layer (Y) as obtained after the first heat treatment step (II-1) in the step (II) and then perform the second heat treatment step (II-2) in the step (II).

The solids concentration in the coating liquid (T) is preferably 0.01 to 60 wt %, more preferably 0.1 to 50 wt %, and even more preferably 0.2 to 40 wt % in terms of the storage stability of the liquid or the quality of application of the liquid. The solids concentration can be determined by the same method as described for the coating liquid (S). The coating liquid (T) may contain another component (e.g., the polymer compound (F)) that may be contained in the layer (Y) described above, as long as the effect of the present invention is obtained.

As is the case for application of the coating liquid (S), the method for applying the coating liquid (T) is not particularly limited, and any known method can be employed.

The application of the coating liquid (T) is followed by removal of the solvent. The method for removing the solvent from the coating liquid (T) is not particularly limited, and any known drying method can be employed. Examples of the drying method include hot air drying, hot roll contact drying, infrared heating, and microwave heating. The drying temperature is preferably equal to or lower than the onset temperature of fluidization of the base (X). The temperature employed for drying the applied coating liquid (T) may be, for example, around 90 to 240° C., and is preferably 100 to 200° C.

The step (II) can be performed using a heating system arranged following that for the step (I) or a heating system identical to that for the step (I) and capable of changing the heating temperature stepwise. The step (II) may be performed prior to the step (I').

In a preferred embodiment of the method for producing a multilayer structure according to the present invention, the application of the coating liquid (S) is followed by drying to form the precursor layer of the layer (Y) in the step (I), and then the heat treatment of the step (II) is performed. In this embodiment, the heat treatment temperature is preferably 30° C. or more higher, and more preferably 50° C. or more higher, than the drying temperature.

In another preferred embodiment of the method for producing a multilayer structure according to the present invention, when the production method includes the step (I'), the application of the coating liquid (S) is followed by drying to form the precursor layer of the layer (Y) in the step (I), and then the first heat treatment step (II-1) of the step (II) is performed. This is followed by the application and drying of the coating liquid (T) in the step (I') and then by the second heat treatment step (II-2) of the step (II). In this embodiment, the temperature of the first heat treatment is preferably 30° C. or more higher, and more preferably 50° C. or more higher, than the drying temperature in the step (I). In addition, the temperature of the second heat treatment is preferably higher than the temperature of the first heat treatment.

In the multilayer structure of the present invention, the layer (Y) may be stacked in direct contact with the base (X). Alternatively, the layer (Y) may be stacked over the base (X), with another member (e.g., the adhesive layer (G) or additional layer (J)) interposed therebetween.

[Extrusion Coating Lamination]

The multilayer structure of the present invention can further include a layer formed by extrusion coating lamination; for example, after the layer (Y) is stacked on the base (X) directly or with the adhesive layer (G) interposed therebetween, the additional layer (J) may be formed by extrusion coating lamination on the layer (Y) directly or with the adhesive layer (G) interposed therebetween. The extrusion coating lamination method available for use in the present invention is not particularly limited, and any known method can be used. In a typical method for extrusion coating lamination, a molten thermoplastic resin is fed to a T-die, and the thermoplastic resin is extruded through a flat slit of the T-die and then cooled to produce a laminated film.

Figure 5:
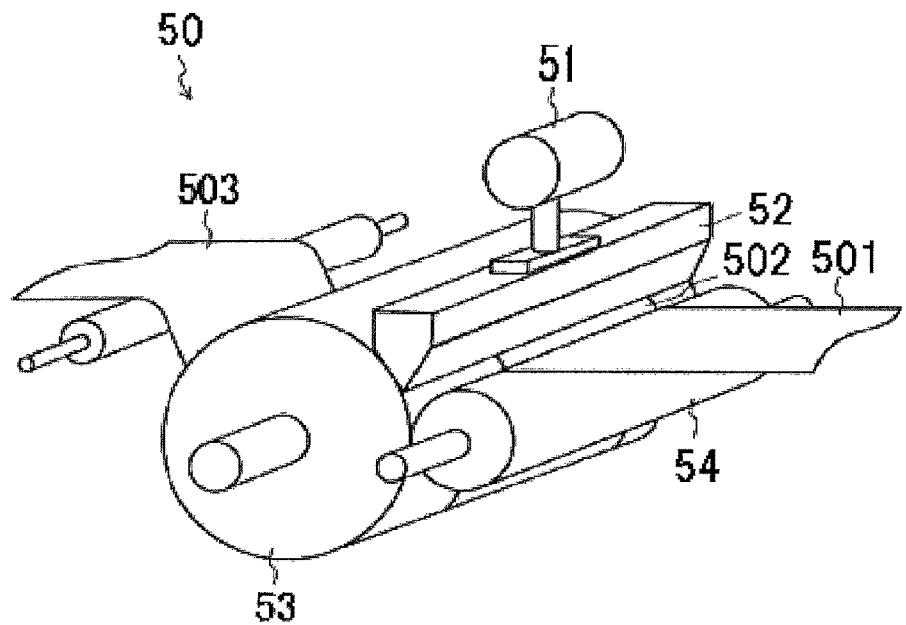
FIG. 5 is a perspective view schematically showing a part of an extrusion coating lamination apparatus used for producing a multilayer structure according to an embodiment of the present invention.

An example of single lamination, which is the most common method for extrusion coating lamination, will now be described with reference to the drawings. An exemplary apparatus used in single lamination is shown in FIG. 5. FIG. 5 schematically shows only a key part of the apparatus, and actual apparatuses are different from that shown in FIG. 5. The apparatus 50 of FIG. 5 includes an extruder 51, a T-die 52, a cooling roll 53, and a rubber roll 54. The cooling roll 53 and the rubber roll 54 are arranged in such a manner that their roll surfaces are in contact with each other.

A thermoplastic resin is heated and melted in the extruder, and then extruded through the flat slit of the T-die 52 into a resin film 502. Meanwhile, a layered product 501 is delivered from a sheet feeder (not shown) and is pressed, together with the resin film 502, between the cooling roll 53 and the rubber roll 54. The layered product 501 and the resin film 502, stacked on each other, are pressed together between the cooling roll 53 and the rubber roll 54 to produce a laminated film (multilayer structure) 503 including the layered product 501 and the resin film 502 united together.

Examples of the method for extrusion coating lamination other than the above single lamination include sandwich lamination and tandem lamination. The sandwich lamination is a method for producing a layered product by extruding a molten thermoplastic resin onto a first base supplied from an unwinder (feed roll) and laminating the extruded thermoplastic rein to a second base supplied from another unwinder. The tandem lamination is a method for producing a layered product consisting of five layers at a time by using two single-lamination machines connected together.

The use of the layered product described above allows fabrication of a multilayer structure that maintains high barrier performance and experiences little decrease in light transmittance even after extrusion coating lamination.

[Adhesive Layer (G)]

In the multilayer structure of the present invention, the adhesion between the base (X) and the layer (Y) can be enhanced by means of the adhesive layer (G). The adhesive layer (G) may be made of an adhesive resin. The adhesive layer (G) made of an adhesive resin can be formed by treating a surface of the base (X) with a known anchor coating agent or applying a known adhesive onto the surface of the base (X). The adhesive is preferably a two-component reactive polyurethane adhesive including a polyisocyanate component and a polyol component which are to be mixed and reacted. Addition of a small amount of an additive such as a known silane coupling agent to the anchor coating agent or adhesive may further enhance the adhesion. Examples of the silane coupling agent include, but are not limited to, silane coupling agents having a reactive group such as an isocyanate, epoxy, amino, ureido, or mercapto group. Strong adhesion between the base (X) and layer (Y) via the adhesive layer (G) makes it possible to effectively prevent deterioration in the gas barrier properties or appearance of the multilayer structure of the present invention when the multilayer structure is subjected to a process such as printing or lamination, and also makes it possible to increase the drop impact resistance of a packaging material including the multilayer structure of the present invention. The thickness of the adhesive layer (G) is preferably 0.01 to 10.0 μm and more preferably 0.03 to 5.0 μm.

[Additional Layer (J)]

The multilayer structure of the present invention may further include the additional layer (J) for improving various properties (such as heat sealing properties, barrier properties, and mechanical properties). The multilayer structure of the present invention that includes the additional layer (J) can be produced, for example, by stacking the layer (Y) on the base (X) directly or with the adhesive layer (G) interposed therebetween and then by attaching or forming the additional layer (J) on the layer (Y) directly or with the adhesive layer (G) interposed therebetween. Examples of the additional layer (J) include, but are not limited to: ink layers; and thermoplastic resin layers such as a polyolefin layer and an ethylene-vinyl alcohol copolymer resin layer.

The multilayer structure of the present invention may include an ink layer on which a product name, decorative pattern, or the like is to be printed. The multilayer structure of the present invention that includes an ink layer can be produced, for example, by staking the layer (Y) on the base (X) directly or with the adhesive layer (G) interposed therebetween and then by forming the ink layer directly on the layer (Y). Examples of the ink layer include a film resulting from drying of a liquid prepared by dispersing a polyurethane resin containing a pigment (e.g., titanium dioxide) in a solvent. The ink layer may be a film resulting from drying of an ink or electronic circuit-forming resist containing a polyurethane resin free of any pigment or another resin as a main component. Methods that can be used to apply the ink layer onto the layer (Y) include gravure printing and various coating methods using a wire bar, a spin coater, or a die coater. The thickness of the ink layer is preferably 0.5 to 10.0 μm and more preferably 1.0 to 4.0 μm.

The polymer (Fa) has at least one functional group selected from the group consisting of an ether bond, a carbonyl group, a hydroxy group, and a carboxyl group which have high affinity to the adhesive layer (G) or additional layer (J) (e.g., the ink layer); therefore, when the layer (Y) of the multilayer structure of the present invention contains the polymer (Fa), the adhesion of the layer (Y) to another layer is enhanced. This can enable the multilayer structure to maintain interlayer adhesion after retorting and thus prevent the multilayer structure from suffering from an appearance defect such as delamination.

Placing a polyolefin layer as an outermost layer of the multilayer structure of the present invention can impart heat-sealing properties to the multilayer structure or improve the mechanical characteristics of the multilayer structure. In terms of, for example, the impartation of heat-sealing properties and the improvement in mechanical characteristics, the polyolefin is preferably polypropylene or polyethylene. It is also preferable to stack at least one film selected from the group consisting of a film made of a polyester, a film made of a polyamide, and a film made of a hydroxy group-containing polymer, in order to improve the mechanical characteristics of the multilayer structure. In terms of the improvement in mechanical characteristics, the polyester is preferably polyethylene terephthalate, and the polyamide is preferably nylon-6. In terms of allowing all the layers to have barrier properties, the hydroxy group-containing polymer is preferably ethylene-vinyl alcohol copolymer. Between the layers there may, if desired, be provided an anchor coat layer or a layer made of an adhesive.

[Configuration of Multilayer Structure]

Specific examples of the configuration of the multilayer structure of the present invention are listed below. The multilayer structure may include a member (e.g., the adhesive layer (G) or additional layer (J)) other than the base (X) and layer (Y); however, the other member is omitted in the following list of specific examples. The multilayer structures listed below as specific examples may be stacked on top of each other or combined with each other.

(1) Layer (Y)/polyester layer,
(2) Layer (Y)/polyester layer/layer (Y),
(3) Layer (Y)/polyamide layer,
(4) Layer (Y)/polyamide layer/layer (Y),
(5) Layer (Y)/polyolefin layer,
(6) Layer (Y)/polyolefin layer/layer (Y),
(7) Layer (Y)/hydroxy group-containing polymer layer,
(8) Layer (Y)/hydroxy group-containing polymer layer/layer (Y),
(9) Layer (Y)/paper layer,
(10) Layer (Y)/paper layer/layer (Y),
(11) Layer (Y)/inorganic deposited layer/polyester layer,
(12) Layer (Y)/inorganic deposited layer/polyamide layer,
(13) Layer (Y)/inorganic deposited layer/polyolefin layer,
(14) Layer (Y)/inorganic deposited layer/hydroxy group-containing polymer layer,
(15) Layer (Y)/polyester layer/polyamide layer/polyolefin layer,
(16) Layer (Y)/polyester layer/layer (Y)/polyamide layer/polyolefin layer,
(17) Polyester layer/layer (Y)/polyester layer/layer (Y)/inorganic deposited layer/hydroxy group-containing polymer layer/polyolefin layer,
(18) Polyester layer/layer (Y)/polyamide layer/polyolefin layer,
(19) Layer (Y)/polyamide layer/polyester layer/polyolefin layer,
(20) Layer (Y)/polyamide layer/layer (Y)/polyester layer/polyolefin layer,
(21) Polyamide layer/layer (Y)/polyester layer/polyolefin layer,
(22) Layer (Y)/polyolefin layer/polyamide layer/polyolefin layer,
(23) Layer (Y)/polyolefin layer/layer (Y)/polyamide layer/polyolefin layer,
(24) Polyolefin layer/layer (Y)/polyamide layer/polyolefin layer,
(25) Layer (Y)/polyolefin layer/polyolefin layer,
(26) Layer (Y)/polyolefin layer/layer (Y)/polyolefin layer,
(27) Polyolefin layer/layer (Y)/polyolefin layer,
(28) Layer (Y)/polyester layer/polyolefin layer,
(29) Layer (Y)/polyester layer/layer (Y)/polyolefin layer,
(30) Polyester layer/layer (Y)/polyolefin layer,
(31) Layer (Y)/polyamide layer/polyolefin layer,
(32) Layer (Y)/polyamide layer/layer (Y)/polyolefin layer,
(33) Polyamide layer/layer (Y)/polyolefin layer,
(34) Layer (Y)/polyester layer/paper layer,
(35) Layer (Y)/polyamide layer/paper layer,
(36) Layer (Y)/polyolefin layer/paper layer,
(37) Polyolefin layer/paper layer/polyolefin layer/layer (Y)/polyester layer/polyolefin layer,
(38) Polyolefin layer/paper layer/polyolefin layer/layer (Y)/polyamide layer/polyolefin layer,
(39) Polyolefin layer/paper layer/polyolefin layer/layer (Y)/polyolefin layer,
(40) Paper layer/polyolefin layer/layer (Y)/polyester layer/polyolefin layer,
(41) Polyolefin layer/paper layer/layer (Y)/polyolefin layer,
(42) Paper layer/layer (Y)/polyester layer/polyolefin layer,
(43) Paper layer/layer (Y)/polyolefin layer,
(44) Layer (Y)/paper layer/polyolefin layer,
(45) Layer (Y)/polyester layer/paper layer/polyolefin layer,
(46) Polyolefin layer/paper layer/polyolefin layer/layer (Y)/polyolefin layer/hydroxy group-containing polymer layer,
(47) Polyolefin layer/paper layer/polyolefin layer/layer (Y)/polyolefin layer/polyamide layer,
(48) Polyolefin layer/paper layer/polyolefin layer/layer (Y)/polyolefin layer/polyester layer,
(49) Inorganic deposited layer/layer (Y)/polyester layer,
(50) Inorganic deposited layer/layer (Y)/polyester layer/layer (Y)/inorganic deposited layer,
(51) Inorganic deposited layer/layer (Y)/polyamide layer,
(52) Inorganic deposited layer/layer (Y)/polyamide layer/layer (Y)/inorganic deposited layer,
(53) Inorganic deposited layer/layer (Y)/polyolefin layer,
(54) Inorganic deposited layer/layer (Y)/polyolefin layer/layer (Y)/inorganic deposited layer Among the above configurations, any of the configurations (1) to (8), (11) to (33), and (49) to (54) is preferred for the protective sheet of the present invention.

The multilayer structure of the present invention preferably has a light transmittance of 87.5% or more, more preferably 87.9% or more, at a wavelength of 420 nm. The method and conditions of measurement of the light transmittance are as described in "EXAMPLES" below.

The multilayer structure of the present invention has an oxygen transmission rate of 2.0 mL/(m²·day·atm) or less, preferably 0.5 mL/(m²·day·atm) or less, more preferably 0.3 mL/(m²·day·atm) or less, at 20° C. and 85% RH before and after the retorting. The conditions of the retorting, and the method and conditions of measurement of the oxygen transmission rate, are as described in "EXAMPLES" below.

The multilayer structure of the present invention preferably has a moisture permeability of 0.5 g/(m²·day) or less, more preferably 0.3 g/(m²·day) or less, at 40° C. and 90% RH before and after retorting. The conditions of the retorting, and the method and conditions of measurement of the moisture permeability, are as described in "EXAMPLES" below.

The multilayer structure and protective sheet of the present invention have an oxygen transmission rate of 2.0 mL/(m²·day·atm) or less, preferably 0.5 mL/(m²·day·atm) or less, more preferably 0.3 mL/(m²·day·atm) or less, at 20° C. and 85% RH before and after a damp heat test. The conditions of the damp heat test, and the method and conditions of measurement of the oxygen transmission rate, are as described in "EXAMPLES" below.

The multilayer structure and protective sheet of the present invention preferably have a moisture permeability of 0.5 g/(m²·day) or less, more preferably 0.3 g/(m²·day) or less, at 40° C. and 90% RH before and after a damp heat test. The conditions of the damp heat test, and the method and conditions of measurement of the moisture permeability, are as described in "EXAMPLES" below.

[Applications]

The multilayer structure of the present invention and a packaging material including the multilayer structure have good gas barrier properties and good water vapor barrier properties and further have high retort resistance and high transparency. Thus, the multilayer structure of the present invention and the packaging material including the multilayer structure can be used in various applications.

[Packaging Material]

The packaging material of the present invention includes a multilayer structure including a base (X) and a layer (Y) stacked on the base (X). The packaging material may consist only of the multilayer structure. That is, in the following description, the term "packaging material" may be interchanged with the term "multilayer structure". In addition, the term "packaging material" is typically interchangeable with the term "package". The packaging material may be composed of the multilayer structure and another member.

The packaging material according to a preferred embodiment of the present invention has barrier properties against inorganic gases (such as hydrogen, helium, nitrogen, oxygen, and carbon dioxide), natural gases, water vapor, and organic compounds that are liquid at ordinary temperature and pressure (such as ethanol and gasoline vapor).

When the packaging material of the present invention is in the form of a packaging bag, the multilayer structure may be used over the entirety of the packaging bag or the multilayer structure may be used in a part of the packaging bag. For example, the multilayer structure may constitute 50% to 100% of the overall area of the packaging bag. The same applies to the case where the packaging material is in a form other than a packaging bag (a container or lid, for example).

The packaging material of the present invention can be fabricated by various methods. For example, a container (packaging material) may be fabricated by subjecting a sheet of the multilayer structure or a film material including the multilayer structure (such a material will hereinafter be simply referred to as "film material") to a joining process and thereby forming the sheet of the multilayer structure or the film material into a predetermined container shape. Examples of the method for shaping include thermoforming, injection molding, and extrusion blow molding. Alternatively, a container (packaging material) may be fabricated by forming the layer (Y) on the base (X) that has been formed in a predetermined container shape beforehand. A container thus fabricated may be referred to as a "packaging container" herein.

The packaging material of the present invention is preferably used as a food packaging material. The packaging material of the present invention can be preferably used not only as a food packaging material but also as a packaging material for packaging any of the following: chemicals such as agrochemicals and pharmaceuticals; medical devices; industrial materials such as machinery components and delicate materials; and garments.

The packaging material including the multilayer structure of the present invention can be used after being formed into any of various shaped products by secondary processing. Such a shaped product may be a vertical form-fill-seal bag, a vacuum packaging bag, a pouch, a laminated tube container, an infusion bag, a paper container, a strip tape, a container lid, an in-mold labeled container, a vacuum insulator, or an electronic device. These shaped products may be formed through heat sealing.

[Vertical Form-fill-seal Bag]

The packaging material including the multilayer structure of the present invention may be a vertical form-fill-seal bag. An example is shown in FIG. 1. A vertical form-fill-seal bag 10 of FIG. 1 is formed of a multilayer structure 11 of the present invention that is sealed at three portions, i.e., two edge portions 11a and a body portion 11b. The vertical form-fill-seal bag 10 can be produced by a vertical form-fill-seal machine. Various methods can be employed for bag making by a vertical form-fill-seal machine. In any method, the substance to be contained in the bag is fed through the top opening of the bag into its interior, and the opening is then sealed to produce the vertical form-fill-seal bag. The vertical form-fill-seal bag is composed of, for example, one film material heat-sealed at three portions, its upper edge, lower edge, and side. The vertical form-fill-seal bag as the packaging container according to the present invention has good gas barrier properties and good water vapor barrier properties and maintains its barrier performance even after retorting. The vertical form-fill-seal bag is therefore capable of preventing quality degradation of the contained substance over a long period of time.

[Pouch]

Figure 2:
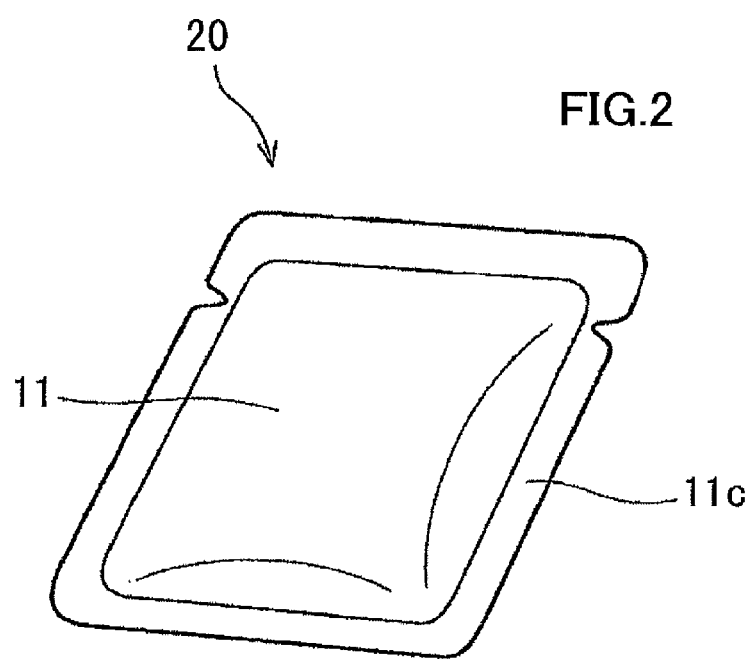
FIG. 2 is a schematic diagram of a flat pouch according to an embodiment of the present invention.

The packaging material including the multilayer structure of the present invention may be a pouch. An example is shown in FIG. 2. A flat pouch 20 of FIG. 2 is formed of two multilayer structures 11 joined together at their edges 11c. The term "pouch" as used herein generally refers to a container including a film material as a barrier member and mainly intended to contain a food, a daily commodity, or a medical product. Pouches can have various shapes and applications, and examples include a spouted pouch, a zippered pouch, a flat pouch, a stand-up pouch, a horizontal form-fill-seal pouch, and a retort pouch. Such a pouch may be formed by stacking a multilayer structure and at least one additional layer (J) together. The pouch as the packaging container according to the present invention has good gas barrier properties and good water vapor barrier properties and maintains its barrier performance even after retorting. The use of the pouch can therefore prevent the contained substance from changing in quality after transportation or long-term storage. In an example, the pouch can hold good transparency, which allows easy identification of the contained substance and easy check for change in the quality of the contained substance caused by degradation.

[Infusion Bag]

Figure 3:
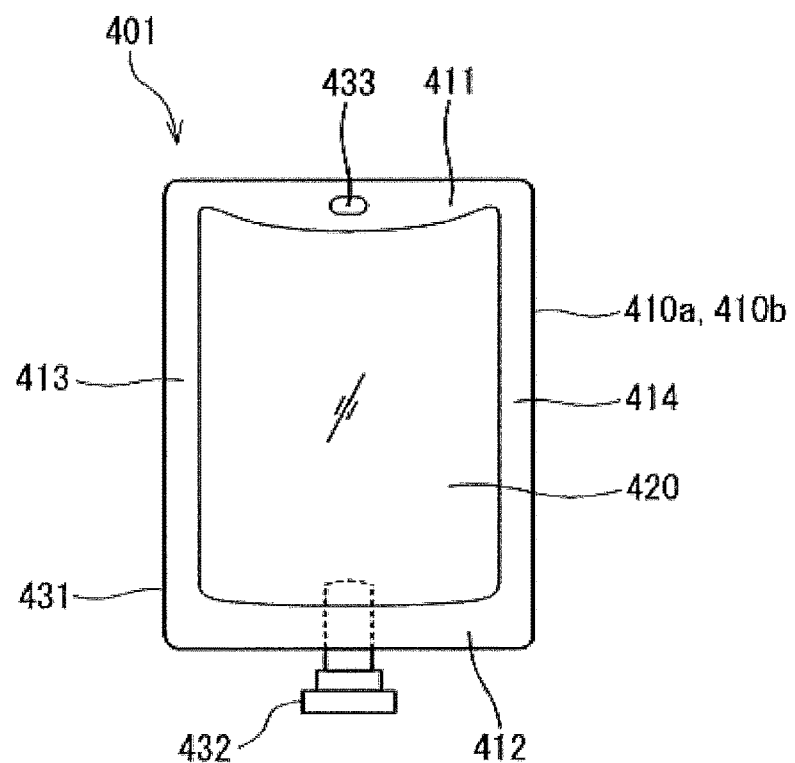
FIG. 3 is a schematic diagram of an exemplary infusion bag according to an embodiment of the present invention.

The packaging material including the multilayer structure of the present invention may be an infusion bag. The infusion bag is a container intended to contain an infusion chug and includes a film material as a separation barrier separating the interior for containing the infusion drug from the outside. An example is shown in FIG. 3. As shown in FIG. 3, the infusion bag includes a bag body 431 for containing a substance and may further include a plug member 432 attached at an edge 412 of the bag body 431. The plug member 432 functions as a passage for letting out an infusion contained in the interior of the bag body 431. The infusion bag may include a hanging hole 433 for hanging the bag, the hole being formed in an edge 411 opposite to the edge 412 at which the plug member 432 is attached. The bag body 431 is formed of two film materials 410a and 410b joined together at the edges 411, 412, 413, and 414. The film materials 410a and 410b function together as a separation barrier 420 separating the interior of the bag from the outside of the bag in a central portion of the bag body 431 which is bounded by the edges 411, 412, 413, and 414. The infusion bag as the packaging container according to the present invention has good gas barrier properties and maintains the gas barrier properties even after thermal treatment such as hot water treatment. The infusion bag is therefore capable of preventing the contained liquid medical product from changing in quality before, during, and after heat sterilization, after transportation, and after storage.

[In-mold Labeled Container]

The packaging material including the multilayer structure of the present invention may be an in-mold labeled container. The in-mold labeled container includes a container body and a multilayer label (multilayer structure) according to the present invention which is provided on the surface of the container body. The container body is formed through injection of a molten resin into a mold. The shape of the container body is not particularly limited, and may be, for example, a cup shape or bottle shape.

An example of the method for producing a container according to the present invention includes: a first step of placing a multilayer label of the present invention in a cavity between a female mold member and a male mold member; and a second step of injecting a molten resin into the cavity to perform molding of a container body and lamination of the multilayer label of the present invention to the container body simultaneously. Each step can be carried out in the same manner as in known methods, except for using the multilayer label of the present invention.

Figure 4:
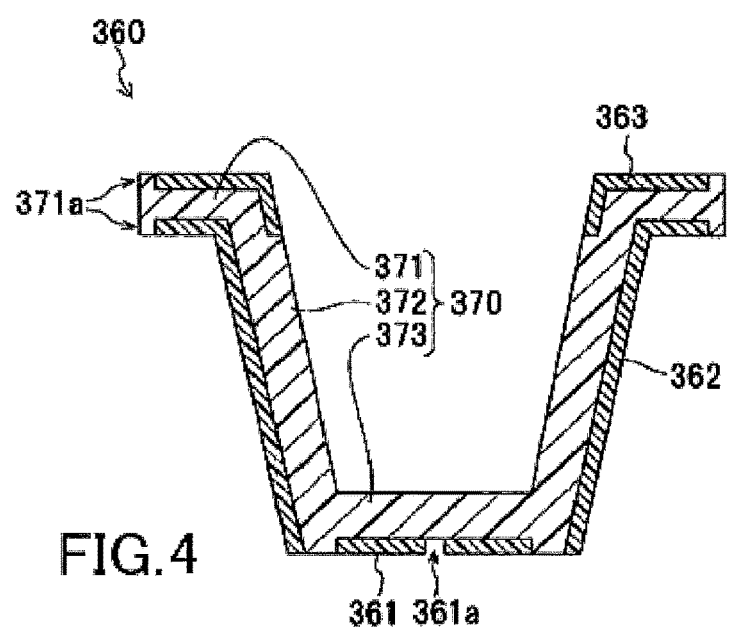
FIG. 4 is a schematic diagram of an exemplary in-mold labeled container according to an embodiment of the present invention.

A cross-sectional view of an example of the container of the present invention is shown in FIG. 4. A container 360 includes a cup-shaped container body 370 and multilayer labels 361 to 363 laminated to surfaces of the container body 370. The multilayer labels 361 to 363 are each the multilayer label of the present invention. The container body 370 includes a flange portion 371, a body portion 372, and a bottom portion 373. The flange portion 371 has at its edges projections 371a extending upwardly and downwardly. The multilayer label 361 is disposed to cover the outer surface of the bottom portion 373. At the center of the multilayer label 361 there is formed a through hole 361a for resin injection in the in-mold labeling. The multilayer label 362 is disposed to cover the outer surface of the body portion 372 and the under surface of the flange portion 371. The multilayer label 363 is disposed to cover a part of the inner surface of the body portion 372 and the top surface of the flange portion 371. The multilayer labels 361 to 363 are fused with the container body 370 and united with the container body 360 by in-mold labeling. As shown in FIG. 4, the edge surfaces of the multilayer label 363 are fused with the container body 360 and are not exposed to the outside.

[Vacuum Insulator]

A product according to the present invention which includes the packaging material as described above in at least a part thereof may be a vacuum insulator. The vacuum insulator is a heat insulator including a sheath material and a core material disposed in an interior bounded by the sheath material, and the interior in which the core material is disposed has a reduced pressure. A vacuum insulator thinner and lighter than an insulator made of urethane foam can provide heat insulating properties comparable to the heat insulating properties provided by the urethane foam insulator. The vacuum insulator of the present invention can be used, for example, as or in: a heat insulating material for home electric appliances such as refrigerators, hot-water supply systems, and rice cookers; a residential heat insulating material used in walls, ceilings, attics, floors, etc.; a vehicle roof member; an insulating panel for automatic vending machines etc.; and a heat transfer apparatus such as a heat storage apparatus or an apparatus employing a heat pump. When used as the sheath material, the multilayer structure of the present invention preferably includes an ethylene-vinyl alcohol copolymer resin layer and an inorganic deposited layer and may have, for example, a configuration of "polyester layer/layer (Y)/polyester layer/layer (Y)/inorganic deposited layer/ethylene-vinyl alcohol copolymer layer/polyolefin layer".

Figure 6:
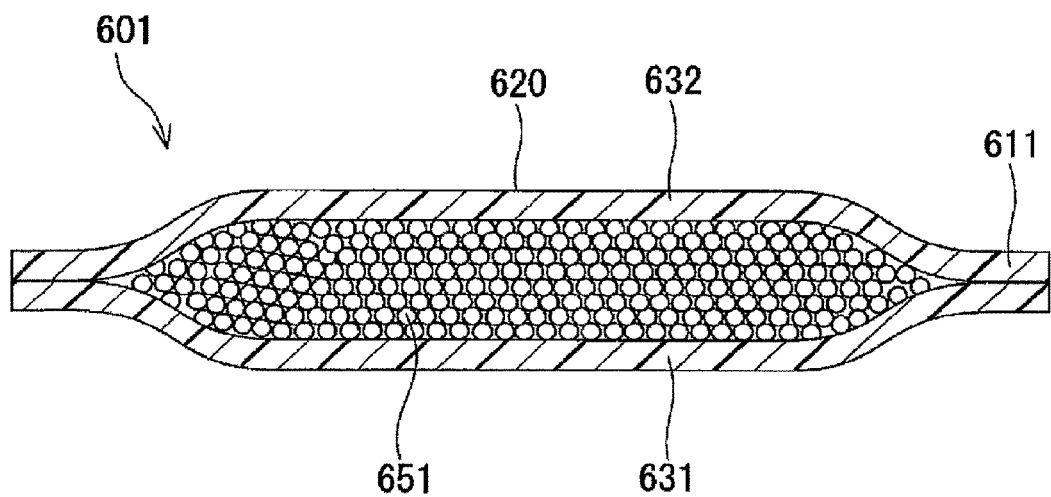
FIG. 6 is a schematic diagram of an exemplary vacuum insulator according to an embodiment of the present invention.

An example of the vacuum insulator of the present invention is shown in FIG. 6. A vacuum insulator 601 of FIG. 6 includes a core material 651 in the form of particles and two multilayer structures 631 and 632 of the present invention that together form a sheath material enclosing the core material 651. The two multilayer structures 631 and 632 are joined together at their edges 611. The interior defined by the two multilayer structures 631 and 632 is packed with the core material 651, and the interior has a reduced pressure. The two multilayer structures 631 and 632 function together as a separation barrier separating the interior containing the core material 651 from the outside and, due to pressure difference between the inside and outside of the vacuum insulator 601, are in close contact with the core material 651. The interior in which the core material 652 is disposed has a reduced pressure.

Figure 7:
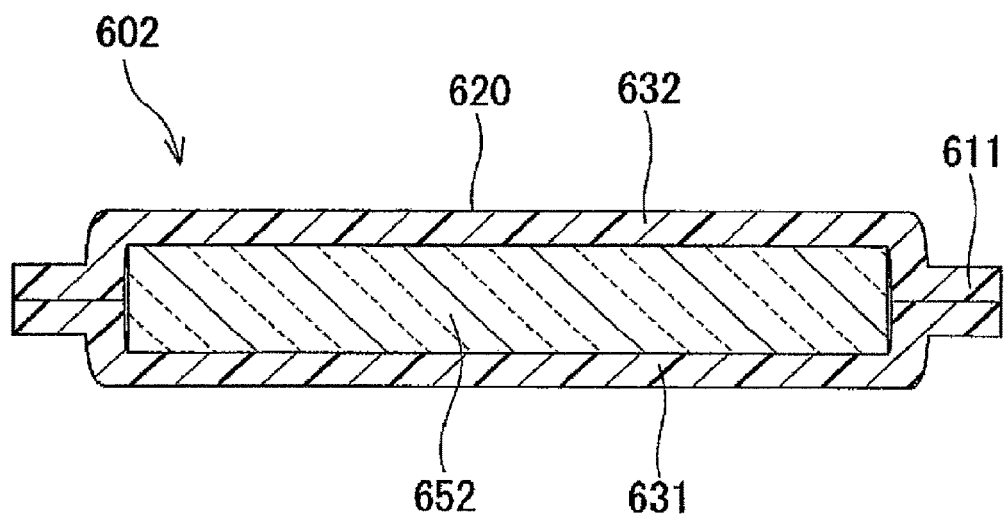
FIG. 7 is a schematic diagram of another exemplary vacuum insulator according to an embodiment of the present invention.

Another example of the vacuum insulator of the present invention is shown in FIG. 7. A vacuum insulator 602 has the same configuration as the vacuum insulator 601, except for including, instead of the core material 651, a core material 652 formed as a single body. The core material 652, which is a shaped product, is typically a foamed resin.

The component and form of the core material are not particularly limited as long as they are adapted for heat insulation. Examples of the core material include a perlite powder, a silica powder, a precipitated silica powder, diatomite, calcium silicate, glass wool, rockwool, artificial (synthetic) wool, and foamed resins (such as styrene foam and urethane foam). A hollow container or honeycomb structure formed in a predetermined shape can also be used as the core material.

[Electronic Device]

Figure 8:
FIG. 8 is a partial cross-sectional view of an electronic device according to an embodiment of the present invention.

The packaging material including the multilayer structure of the present invention can be used also in an electronic device. A partial cross-sectional view of an example of the electronic device according to the present invention is shown in FIG. 8. An electronic device 40 of FIG. 8 includes an electronic device body 41, a sealing material 42 for sealing the electronic device body 41, and a protective sheet (multilayer structure) 43 for protecting the surface of the electronic device body 41. The sealing material 42 covers the entire surface of the electronic device body 41. The protective sheet 43 is disposed over one side of the electronic device body 41, with the sealing material 42 interposed therebetween. On the side opposite to that on which the protective sheet 43 is disposed there may be disposed another protective sheet. In this case, the protective sheet disposed on the opposite side may be the same as or different from the protective sheet 43. The protective sheet 43 may be disposed on the electronic device body 41, with another member such as the sealing material 42 interposed therebetween, or may be disposed directly on the surface of the electronic device body 41.

Examples of the electronic device body 41 include, but are not limited to: photoelectric conversion devices such as solar cells; information display devices such as organic EL displays, liquid crystal displays, and electronic paper; and lighting devices such as organic EL elements. The sealing material 42 is an optional member that can be added as appropriate depending on, for example, the type and use of the electronic device body 41. Examples of the sealing material 42 include ethylene-vinyl acetate copolymer and polyvinyl butyral.

A preferred example of the electronic device body 41 is a solar cell. Examples of the solar cell include a silicon solar cell, a compound semiconductor solar cell, and an organic thin-film solar cell. Examples of the silicon solar cell include a monocrystalline silicon solar cell, a polycrystalline silicon solar cell, and an amorphous silicon solar cell. Examples of the compound semiconductor solar cell include a III-V compound semiconductor solar cell, a II-VI compound semiconductor solar cell, and a I-III-VI compound semiconductor solar cell. The solar cell may or may not be an integrated solar cell including a plurality of unit cells connected in series.

The multilayer structure of the present invention and the packaging material including the multilayer structure are suitable for use as or in the following: a display member such as a substrate film for LCDs, a substrate film for organic ELs, a substrate film for electronic paper, a sealing film for electronic devices, or a film for PDPs; a film for IC tags; a solar cell module; and a solar cell member such as a back sheet for solar cells and a protective film for solar cells. When used as a member of a display, the multilayer structure functions, for example, as a low-reflection film. In any case where the multilayer structure is required to be light-transmissive, the layer (Y) that has light transmissivity is used.

Depending on its type, the electronic device body 41 can be fabricated by a so-called roll-to-roll process. In the roll-to-roll process, a flexible substrate (e.g., a stainless steel substrate or a resin substrate) wound around a feed roll is delivered from the feed roll, then an element is formed on this substrate to fabricate the electronic device body 41, and finally the electronic device body 41 is wound on a take-up roll. In this case, it is advantageous that the protective sheet 43 be prepared beforehand in the form of a flexible long sheet, more particularly in the form of a wound roll of the long sheet. In an example, the protective sheet 43 delivered from a feed roll is stacked onto the electronic device body 41 that has yet to be wound on the take-up roll and is wound up together with the electronic device body 41. In another example, the electronic device body 41 that has been wound on the take-up roll once may be fed from the roll again and stacked onto the protective sheet 43. In a preferred example of the present invention, the electronic device per se has flexibility.

The protective sheet 43 includes the multilayer structure of the present invention. The protective sheet 43 may consist only of the multilayer structure. Alternatively, the protective sheet 43 may include the multilayer structure and another member (e.g., the additional layer (J)) stacked on the multilayer structure. The thickness and material of the protective sheet 43 are not particularly limited, as long as the sheet is a sheet of layered product suitable for protection of a surface of an electronic device and includes the multilayer structure described above.

The protective sheet may include, for example, a surface protection layer disposed on one or both of the surfaces of the multilayer structure. It is preferable for the surface protection layer to be a layer made of a scratch-resistant resin. A surface protection layer for a device such as a solar cell which may be used outdoors is preferably made of a resin having high weather resistance (e.g., light resistance). For protecting a surface required to permit transmission of light, a surface protection layer having high light transmissivity is preferred. Examples of the material of the surface protection layer (surface protection film) include poly(meth) acrylic acid ester, polycarbonate, polyethylene terephthalate, polyethylene-2,6-naphthalate, polyvinyl fluoride (PVF), polyvinylidene fluoride (PVDF), polytetrafluoroethylene (PTFE), polychlorotrifluoroethylene (PCTFE), ethylene-tetrafluoroethylene copolymer (ETFE), ethylene-chlorotrifluoroethylene copolymer (ECTFE), tetrafluoroethylene-perfluoroalkyl vinyl ether copolymer (PFA), and tetrafluoroethylene-hexafluoropropylene copolymer (FEP). In an example, the protective sheet includes a poly(meth) acrylic acid ester layer disposed on one of its sides.

An additive (e.g., an ultraviolet absorber) may be added to the surface protection layer to increase the durability of the surface protection layer. A preferred example of the surface protection layer having high weather resistance is an acrylic resin layer to which an ultraviolet absorber has been added. Examples of the ultraviolet absorber include, but are not limited to, ultraviolet absorbers based on benzotriazole, benzophenone, salicylate, cyanoacrylate, nickel, or triazine. In addition, another additive such as a stabilizer, light stabilizer, or antioxidant may be used in combination.

EXAMPLES

Hereinafter, the present invention will be described in more detail by way of examples. The present invention is not limited by these examples in any respect, and many modifications are possible by any ordinarily skilled person in the art within the technical concept of the present invention. Analysis and evaluation in Examples and Comparative Examples given below were performed as will now be described.

(1) Measurement of Infrared Absorption Spectrum

The measurement was performed by attenuated total reflection spectroscopy using a Fourier transform infrared spectrophotometer. The measurement conditions were as follows.

Apparatus: Spectrum One, manufactured by PerkinElmer, Inc.

Measurement mode: Attenuated total reflection spectroscopy
Measurement range: 800 to 1,400 cm$^{-1}$ (2) Measurement of Respective Thicknesses of Layers Each multilayer structure was cut using a focused ion beam (FIB) to prepare a section for cross-sectional observation. The prepared section was secured to a sample stage with a carbon tape and subjected to platinum ion sputtering at an accelerating voltage of 30 kV for 30 seconds. The cross-section of the multilayer structure was observed using a field-emission transmission electron microscope to determine the respective thicknesses of the layers. The measurement conditions were as follows.

Apparatus: JEM-2100F, manufactured by JEOL Ltd.
Accelerating voltage: 200 kV
Magnification: ×250,000

(3) Measurement of Average Particle Diameter

The measurement was performed using an ultra-high-resolution field-emission scanning electron microscope. Specifically, a photograph of particles of the reaction product (D) was taken, and the average particle diameter of particles (100 or more particles) observed in a unit area of field of view in the photograph was calculated using an image-analyzing particle size distribution analysis software (Mac-View Ver. 4, manufactured by Mountech Co., Ltd.). The particle diameter of each particle was determined as an arithmetic mean of the maximum and minimum lengths of the particle, and an average primary particle diameter was calculated from the number and diameters of the particles. The measurement conditions were as follows.

Apparatus: SU8010, manufactured by Hitachi High-Technologies Corporation
Accelerating voltage: 0.5 kV
Magnification: ×100,000

(4) Measurement of Light Transmittance

The transmittance of each multilayer structure was measured in the wavelength range of 200 to 800 nm using an ultraviolet-visible spectrophotometer to determine a light transmittance at 420 nm. The measurement conditions were as follows.

Apparatus: UV-2450, manufactured by Shimadzu Corporation (5) Measurement of Methanol Content Each multilayer structure obtained after application and drying of a coating liquid (S-1) was cut into a strip, which was subjected to headspace GC-MS. As a result, water was only detected while no methanol was detected (lower detection limit: 5 ppm). The measurement conditions were as follows.

Apparatus: COMBI PAL Polaris Q Trace GC available from Thermo Fisher Scientific K.K.
Headspace temperature: 100° C.
Column temperature: Maintained at 40° C. for 5 minutes, then increased up to 140° C. at a rate of 5° C./min, and maintained at 140° C. for 10 minutes
Carrier gas: Helium
Carrier gas flow rate: 1.0 mL/min (6) Measurement of Water Content Each multilayer structure obtained after application and drying of the coating liquid (S-1) was cut into a strip, whose water content was measured with a Karl Fischer water content meter. The water content of the base treated under the same heating conditions (temperature and time) was also measured, and subtracted from the water content of the multilayer structure to determine the water content of the layer (Y) precursor. The measurement conditions were as follows.

Apparatus: CA-06, manufactured by Mitsubishi Kasei Corporation
Temperature: 100° C.
Carrier gas: Nitrogen
Carrier gas flow rate: 0.2 L/min
Titration method: Coulometric titration (7) Measurement of Oxygen Transmission Rate A sample was set to an oxygen transmission rate measurement apparatus in such a manner that the layer as the base faced the carrier gas side, and the oxygen transmission rate was measured by an equal pressure method. The measurement conditions were as follows.

Apparatus: MOCON OX-TRAN 2/20, manufactured by ModernControls, Inc.
Temperature: 20° C.
Humidity on oxygen feed side: 85% RH
Humidity on carrier gas side: 85% RH
Oxygen pressure: 1.0 atm
Carrier gas pressure: 1.0 atm (8) Measurement of Moisture Permeability A sample was set to a water vapor transmission rate measurement apparatus in such a manner that the layer as the base faced the carrier gas side, and the moisture permeability (water vapor transmission rate) was measured by an equal pressure method. The measurement conditions were as follows.

Apparatus: MOCON PERMATRAN W3/33, manufactured by ModernControls, Inc.
Temperature: 40° C.
Humidity on water vapor feed side: 90% RH
Humidity on carrier gas side: 0% RH <Production Example of Coating Liquid (S-1)>

Distilled water in an amount of 230 parts by weight was heated to 70° C. under stirring. Triisopropoxyaluminum in an amount of 88 parts by weight was added dropwise to the distilled water over 1 hour, the liquid temperature was gradually increased to 95° C., and isopropanol generated was distilled off. In this manner, hydrolytic condensation was performed. To the resulting liquid was added 4.0 parts by weight of a 60 wt % aqueous nitric acid solution, and this was followed by stirring at 95° C. for 3 hours to deflocculate agglomerates of particles of the hydrolytic condensate. After that, the liquid was concentrated so that the concentration of solids calculated as aluminum oxide was adjusted to 10 wt %. To 22.50 parts by weight of the solution thus obtained were added 54.29 parts by weight of distilled water and 18.80 parts by weight of methanol. This was followed by stirring to obtain a homogeneous dispersion. Subsequently, 4.41 parts by weight of an 85 wt % aqueous phosphoric acid solution was added dropwise to the dispersion under stirring, with the liquid temperature held at 15° C. The stirring was continued at 15° C. until a viscosity of 1,500 mPa·s was reached. The intended coating liquid (S-1) was thus obtained. In the coating liquid (S-1), the molar ratio between aluminum atoms and phosphorus atoms, as expressed by aluminum atoms:phosphorus atoms, was 1.15:1.00.

<Production Example of Coating Liquid (CS-1)>

Distilled water in an amount of 230 parts by weight was heated to 70° C. under stirring. Triisopropoxyaluminum in an amount of 88 parts by weight was added dropwise to the distilled water over 1 hour, the liquid temperature was gradually increased to 95° C., and isopropanol generated was distilled off. In this manner, hydrolytic condensation was performed. To the resulting liquid was added 4.0 parts by weight of a 60 wt % aqueous nitric acid solution, and this was followed by stirring at 95° C. for 3 hours to deflocculate agglomerates of particles of the hydrolytic condensate. After that, the liquid was concentrated so that the concentration of solids calculated as aluminum oxide was adjusted to 10 wt %. To 29.01 parts by weight of the solution thus obtained were added 48.54 parts by weight of distilled water and 18.80 parts by weight of methanol. This was followed by stirring to obtain a homogeneous dispersion. Subsequently, 3.65 parts by weight of an 85 wt % aqueous phosphoric acid solution was added dropwise to the dispersion under stirring, with the liquid temperature held at 15° C. The stirring was continued at 15° C. until a viscosity of 1,500 mPa·s was reached. The intended coating liquid (CS-1) was thus obtained. In the coating liquid (CS-1), the molar ratio between aluminum atoms and phosphorus atoms, as expressed by aluminum atoms phosphorus atoms, was 1.80=1.00.

<Production Example of Coating Liquid (CS-2)>

Distilled water in an amount of 230 parts by weight was heated to 70° C. under stirring. Triisopropoxyaluminum in an amount of 88 parts by weight was added dropwise to the distilled water over 1 hour, the liquid temperature was gradually increased to 95° C., and isopropanol generated was distilled off. In this manner, hydrolytic condensation was performed. To the resulting liquid was added 4.0 parts by weight of a 60 wt % aqueous nitric acid solution, and this was followed by stirring at 95° C. for 3 hours to deflocculate agglomerates of particles of the hydrolytic condensate. After that, the liquid was concentrated so that the concentration of solids calculated as aluminum oxide was adjusted to 10 wt %. To 17.63 parts by weight of the solution thus obtained were added 58.59 parts by weight of distilled water and 18.80 parts by weight of methanol. This was followed by stirring to obtain a homogeneous dispersion. Subsequently, 4.98 parts by weight of an 85 wt % aqueous phosphoric acid solution was added dropwise to the dispersion under stirring, with the liquid temperature held at 15° C. The stirring was continued at 15° C. until a viscosity of 1,500 mPa·s was reached. The intended coating liquid (CS-2) was thus obtained. In the coating liquid (CS-2), the molar ratio between aluminum atoms and phosphorus atoms, as expressed by aluminum atoms:phosphorus atoms, was 0.80:1.00.

<Synthesis Example of Organic Phosphorus Compound (BO-1)>

Under a nitrogen atmosphere, 10 g of vinylphosphonic acid and 0.025 g of 2,2'-azobis(2-amidinopropane) dihydrochloride were dissolved in 5 g of water, and the resulting solution was stirred at 80° C. for 3 hours. After being cooled, the polymer solution was diluted by addition of 15 g of water and then filtered using "Spectra/Por" (registered trademark), a cellulose membrane manufactured by Spectrum Laboratories, Inc. Water was removed from the filtrate by distillation, followed by vacuum drying at 50° C. for 24 hours, thus giving a polymer (BO-1). The polymer (BO-1) was poly (vinylphosphonic acid). As a result of GPC analysis, the number-average molecular weight of the polymer was determined to be 10,000 on a polyethylene glycol-equivalent basis.

<Production Example of Coating Liquid (T-1)>

The organic phosphorus compound (BO-1) obtained in the above synthesis example was dissolved in a mixed solvent of water and methanol (at a weight ratio, water:methanol, of 7:3) to obtain a coating liquid (T-1) having a solids concentration of 1 wt %.

<Production Example of Coating Liquid (T-2)>

There was prepared a mixture containing 91 wt % of the organic phosphorus compound (BO-1) obtained in the above synthesis example and 9 wt % of polyvinyl alcohol having a weight-average molecular weight of 100,000 (PVA 124, manufactured by KURARAY CO., LTD.) as the polymer compound (F). This mixture was dissolved in a mixed solvent of water and methanol (at a weight ratio, water:methanol, of 7:3) to obtain a coating liquid (T-2) having a solids concentration of 1 wt %.

<Production Example of Coating Liquid (T-3)>

There was prepared a mixture containing 91 wt % of the organic phosphorus compound (BO-1) obtained in the above synthesis example and 9 wt % of polyethylene oxide having a weight-average molecular weight of 60,000 ("ALKOX (registered trademark) L-6" manufactured by Meisei Chemical Works, Ltd.) as the polymer compound (F). This mixture was dissolved in a mixed solvent of water and methanol (at a weight ratio, water:methanol, of 7:3) to obtain a coating liquid (T-3) having a solids concentration of 1 wt %.

The details of films used in Examples and Comparative Examples were as follows.

1) PET 12: Oriented polyethylene terephthalate film; "Lumirror P60" (trade name), manufactured by Toray Industries, Inc. and having a thickness of 12 μm 2) PET 50: Polyethylene terephthalate film with improved adhesion to ethylene-vinyl acetate copolymer; "SHINE-BEAM Q1A15" (trade name), manufactured by TOYOBO CO., LTD. and having a thickness of 50 μm 3) ONY: Oriented nylon film; "EMBLEM ONBC" (trade name), manufactured by UNITIKA LTD. and having a thickness of 15 μm 4) CPP 60: Non-oriented polypropylene film; "RXC-21" (trade name), manufactured by Mitsui Chemicals Tohcello, Inc. and having a thickness of 60 μm 5) CPP 70: Non-oriented polypropylene film; "RXC-21" (trade name), manufactured by Mitsui Chemicals Tohcello, Inc. and having a thickness of 70 μm 6) CPP 100: Non-oriented polypropylene film; "RXC-21" (trade name), manufactured by Mitsui Chemicals Tohcello, Inc. and having a thickness of 100 μm Example 1

Example 1-1

First, a PET 12 (which may hereinafter be abbreviated as "X-1") was prepared as the base (X). The coating liquid (S-1) was applied onto the base using a bar coater in such a manner that the dry thickness would be 0.3 μm. The film of the applied liquid was dried at 110° C. for 5 minutes to form a precursor of a layer (Y-1-1) on the base. In this way, a structure having a configuration of "base (X-1)/layer (Y-1-1) precursor" was obtained. Subsequently, the structure was heat-treated at 160° C. for 1 minute and then at 220° C. for 1 minute to form the layer (Y-1-1). In this way, a multilayer structure (1-1-1) having a configuration of "base (X-1)/layer (Y-1-1)" was obtained.

As a result of measurement of the infrared absorption spectrum of the multilayer structure (1-1-1), the maximum absorption wavenumber in the region from 800 to 1,400 $cm^{-1}$ was determined to be 1,108 $cm^{-1}$, and the width at half maximum of the maximum absorption band was determined to be 37 $cm^{-1}$.

The light transmittance of the multilayer structure (1-1-1) at a wavelength of 420 nm and the average particle diameter of the reaction product (D) forming the layer (Y-1-1) were measured. The results are shown in Table 1.

An adhesive layer was formed on the multilayer structure (1-1-1) obtained as above, and an ONY was laminated on the adhesive layer to obtain a layered product. Next, an adhesive layer was formed on the ONY of the layered product, and then a CPP 70 was laminated on the adhesive layer. The resulting laminate was allowed to stand at 40° C. for 5 days for aging. In this way, a multilayer structure (1-1-2) having a configuration of "base (X-1)/layer (Y-1-1)/adhesive layer/ONY/adhesive layer/CPP" was obtained. The two adhesive layers were each formed by applying a two-component adhesive using a bar coater in such a manner that the dry thickness would be 3 μm and then by drying the adhesive. The two-component adhesive used was a two-component reactive polyurethane adhesive composed of "A-520" (product name) of "TAKELAC" (registered trademark) manufactured by Mitsui Chemicals, Inc. and "A-50" (product name) of "TAKENATE" (registered trademark) manufactured by Mitsui Chemicals, Inc. The oxygen transmission rate and moisture permeability of the multilayer structure (1-1-2) were measured. The results are shown in Table 1.

The multilayer structure (1-1-2) was heat-sealed to form a pouch, and the pouch was filled with 100 g of water. The pouch thus obtained was then subjected to retorting (hot water retaining method) under the following conditions.

Retorting apparatus: Flavor Ace RSC-60, manufactured by HISAKA WORKS, LTD.
Temperature: 130° C.
Time: 30 minutes
Pressure: 0.21 MPaG Immediately after the hot water treatment, a measurement sample was cut out from the pouch, and the oxygen transmission rate and moisture permeability of the sample were measured. The results are shown in Table 1.

Comparative Examples 1-1 and 1-2

Multilayer structures (C1-1-1) and (C1-2-1) were fabricated in the same manner as in the fabrication of the multilayer structure (1-1-1) of Example 1-1, except for using the coating liquid (CS-1) or (CS-2) instead of the coating liquid (S-1). Multilayer structures (C1-1-2) and (C1-2-2) were fabricated in the same manner as in the fabrication of the multilayer structure (1-1-2) of the Example 1-1, except for substituting the multilayer structure (1-1-1) with the multilayer structure (C1-1-1) or (C1-2-1). The various properties of the multilayer structures obtained were measured in the same manner as in Example 1-1. The results are shown in Table 1.

TABLE 1

| | Base (X) | Layer (Y) | | | | IR | |
|---|---|---|---|---|---|---|---|
| | | Coating liquid (S) No. | Thickness (μm) | Composition (molar ratio) Al | P | Maximum absorption ($cm^{-1}$) | Width at half maximum ($cm^{-1}$) |
| Example 1-1 | X-1 | S-1 | 0.3 | 1.15 | 1.00 | 1,108 | 37 |
| Comparative Example 1-1 | X-1 | CS-1 | 0.3 | 1.80 | 1.00 | 1,099 | 37 |
| Comparative Example 1-2 | X-1 | CS-2 | 0.3 | 0.80 | 1.00 | 1,113 | 30 |

| | Before treatment | | After retorting | | Reaction product (D) | Light |
|---|---|---|---|---|---|---|
| | Oxygen transmission rate (mL/($m^2$·day·atm)) | Moisture permeability (g/($m^2$·day)) | Oxygen transmission rate (mL/($m^2$·day·atm)) | Moisture permeability (g/($m^2$·day)) | Average particle diameter (nm) | transmittance (420 nm) (%) |
| Example 1-1 | 0.2 | 0.3 | 0.1 | 0.2 | 60.0 | 88.0 |
| Comparative Example 1-1 | <0.1 | 0.4 | 3.3 | 9.0 | <5 | 87.7 |
| Comparative Example 1-2 | >20 | >20 | — | — | >100 | 86.4 |

* "—" means that the measurement was impossible due to delamination of the multilayer structure which occurred after retorting.

Example 1-2

A vacuum insulator was fabricated using the multilayer structure (1-1-2) as obtained in Example 1-1. Specifically, the multilayer structure (1-1-2) was first cut into two pieces of a given shape. The two pieces of the multilayer structure (1-1-2) were then stacked together in such a manner that the CPP layers were located interiorly, and the resulting rectangular stack was heat-sealed at its three sides to form a bag. Next, a heat-insulating core material was put into the bag through the opening of the bag, and the bag was hermetically closed using a vacuum packaging machine (VAC-STAR 2500, manufactured by Frimark GmbH) so that the internal pressure was 10 Pa at a temperature of 20° C. In this way, a vacuum insulator was successfully fabricated without any problem. The heat-insulating core material used was a fine silica powder dried at 120° C. for 4 hours.

Example 1-3

A solar cell module was fabricated using the multilayer structure (1-1-1) as obtained in Example 1-1. Specifically, first, an amorphous silicon solar cell placed on a 10-cm-square tempered glass plate was sandwiched between ethylene-vinyl acetate copolymer films with a thickness of 450 μm. The multilayer structure (1-1-1) was then bonded onto one of the films in such a manner that the PET layer of the multilayer structure (1-1-1) faced outwardly. In this way, a solar cell module was fabricated. The bonding was accomplished by vacuum drawing at 150° C. for 3 minutes, followed by compression bonding for 9 minutes. The solar cell module thus fabricated operated well and continued to show good electrical output characteristics over a long period of time.

Example 2

Example 2-1

First, a PET 12 (X-1) was prepared as the base (X). The coating liquid (S-1) was applied onto the base using a bar coater in such a manner that the dry thickness would be 0.3 µm. The film of the applied liquid was dried at 80° C. for 10 minutes to form a precursor of a layer (Y-2-1) on the base. A structure having a configuration of "base (X-1)/layer (Y-2-1) precursor" was thus obtained. For the structure obtained, the infrared absorption spectrum of the layer (Y) precursor, the average particle diameter of the reaction product (D) precursor, and the content of the solvent (including methanol and water) were measured by the methods described above. Subsequently, the structure was heat-treated at 180° C. for 3 minutes and then at 220° C. for 10 seconds to form the layer (Y-2-1). In this way, a multilayer structure (2-1-1) having a configuration of "base (X-1)/layer (Y-2-1)" was obtained.

Figure 9:
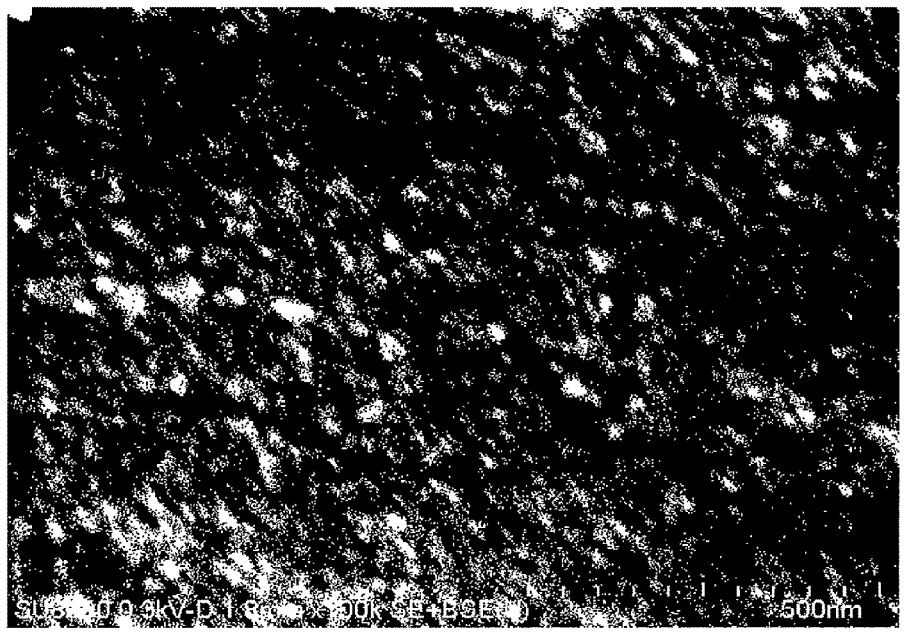
FIG. 9 is a SEM photograph of a precursor of a layer (Y-2-1) of a multilayer structure obtained in Example 2-1.
Figure 10:
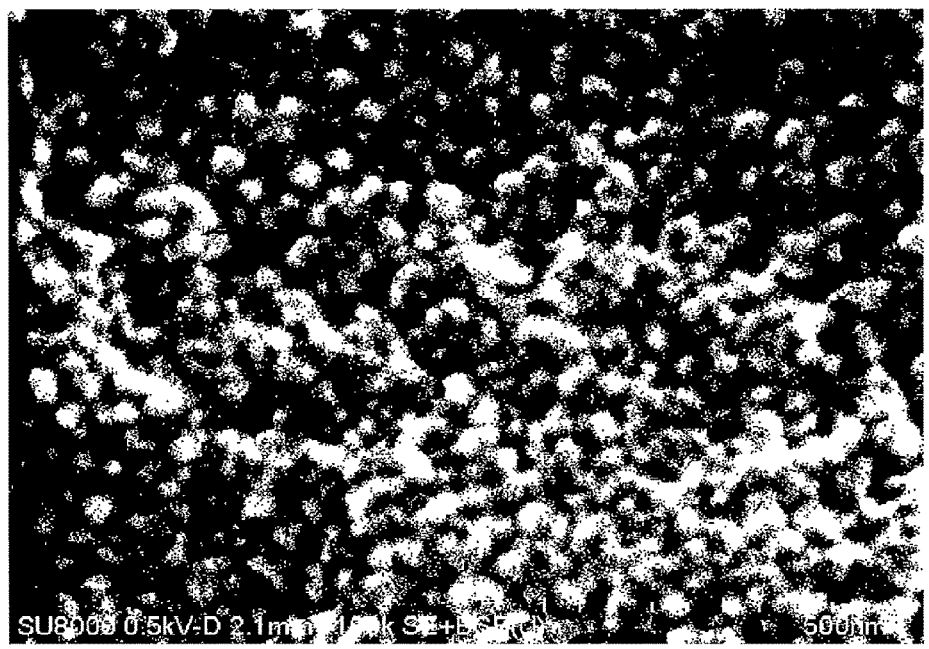
FIG. 10 is a SEM photograph of the layer (Y-2-1) of the multilayer structure obtained in Example 2-1.
Figure 11:
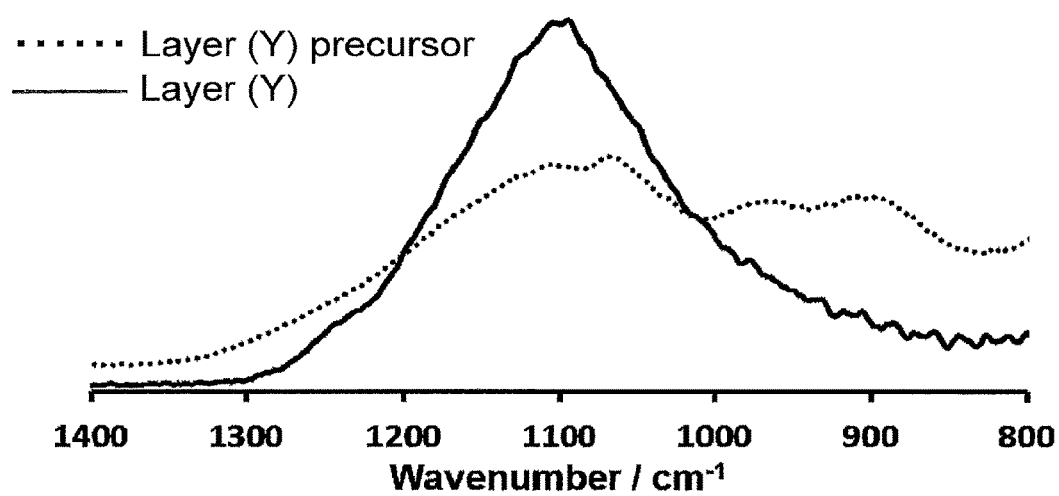
FIG. 11 shows an infrared absorption spectrum of the precursor of the layer (Y-2-1) obtained in Example 2-1 and an infrared absorption spectrum of the layer (Y-2-1) of the multilayer structure obtained in Example 2-1.

Table 1 shows the average particle diameter of the reaction product (D) precursor, the solvent content, and the $A_R/A_Y$ in the layer (Y-2-1) precursor and also shows the average particle diameter of the reaction product (D) in the layer (Y-2-1). FIG. 9 shows a SEM photograph of the precursor of the layer (Y-2-1) of the multilayer structure (2-1-1) obtained as above, FIG. 10 shows a SEM photograph of the layer (Y-2-1), and FIG. 11 shows the results of measurement of infrared absorption spectra of the precursor and the layer (Y-2-1).

An adhesive layer was formed on the multilayer structure (2-1-1) obtained as above, and an ONY was laminated on the adhesive layer to obtain a layered product. Next, an adhesive layer was formed on the ONY of the layered product, and then a CPP 70 was laminated on the adhesive layer. The resulting laminate was allowed to stand at 40° C. for 5 days for aging. In this way, a multilayer structure (2-1-2) having a configuration of "base (X-1)/layer (Y-2-1)/adhesive layer/ONY/adhesive layer/CPP" was obtained. The two adhesive layers were each formed by applying a two-component adhesive using a bar coater in such a manner that the dry thickness would be 3 µm and then by drying the adhesive. The two-component adhesive was identical to that used in Example 1-1. The oxygen transmission rate and moisture permeability of the multilayer structure (2-1-2) were measured. The results are shown in Table 2.

The multilayer structure (2-1-2) was heat-sealed to form a pouch, and the pouch was filled with 100 g of water. The pouch thus obtained was then subjected to retorting (hot water retaining method) under the following conditions.

Retorting apparatus: Flavor Ace RSC-60, manufactured by HISAKA WORKS, LTD.
Temperature: 130° C.
Time: 60 minutes
Pressure: 0.21 MPaG Immediately after the hot water treatment, a measurement sample was cut out from the pouch, and the oxygen transmission rate and moisture permeability of the sample were measured. The results are shown in Table 2.

Examples 2-2 and 2-3

Multilayer structures (2-2-2) and (2-3-2) were fabricated in the same manner as in the fabrication of the multilayer structure (2-1-2) of Example 2-1, except for changing the drying of the applied coating liquid (S-1) from drying at 80° C. for 10 minutes to drying at 120° C. for 3 minutes (Example 2-2) or except for changing the drying of the applied coating liquid (S-1) from drying at 80° C. for 10 minutes to drying at 120° C. for 1 minute and adjusting the dry thickness from 0.3 µm to 0.45 µm (Example 2-3). The various properties of the multilayer structures obtained were measured in the same manner as in Example 2-1. The results are shown in Table 2.

Example 2-4

A multilayer structure (2-4-2) was fabricated in the same manner as in the fabrication of the multilayer structure (2-1-2) of Example 2-1, except that the heat treatment at 180° C. for 3 minutes was followed by applying the coating liquid (T-1) using a bar coater so that the ratio $W_{BO}/W_{BI}$ between the weight $W_{BI}$ of the inorganic phosphorus compound (BI) and the weight $W_{BO}$ of the organic phosphorus compound (BO) was 1.10/98.90, then by drying at 110° C. for 3 minutes, and then by heat treatment at 220° C. for 1 minute. The various properties of the multilayer structure obtained were measured in the same manner as in Example 2-1. The results are shown in Table 2.

Example 2-5

A multilayer structure (2-5-2) was fabricated in the same manner as in the fabrication of the multilayer structure (2-1-2) of Example 2-1, except that the heat treatment at 180° C. for 3 minutes was followed by applying the coating liquid (T-2) using a bar coater so that the ratio $W_{BO}/W_{BI}$ between the weight $W_{BI}$ of the inorganic phosphorus compound (BI) and the weight $W_{BO}$ of the organic phosphorus compound (BO) was 1.10/98.90, then by drying at 110° C. for 3 minutes, and then by heat treatment at 220° C. for 1 minute. The various properties of the multilayer structure obtained were measured in the same manner as in Example 2-1. The results are shown in Table 2.

Example 2-6

A multilayer structure (2-6-2) was fabricated in the same manner as in the fabrication of the multilayer structure (2-1-2) of Example 2-1, except that the heat treatment at 180° C. for 3 minutes was followed by applying the coating liquid (T-3) using a bar coater so that the ratio $W_{BO}/W_{BI}$ between the weight $W_{BI}$ of the inorganic phosphorus compound (BI) and the weight $W_{BO}$ of the organic phosphorus compound (BO) was 1.10/98.90, then by drying at 110° C. for 3 minutes, and then by heat treatment at 220° C. for 1 minute. The various properties of the multilayer structure obtained were measured in the same manner as in Example 2-1. The results are shown in Table 2.

Examples 2-7 to 2-11 and Comparative Examples 2-1 to 2-7

Multilayer structures (2-7-2) to (2-11-2) and multilayer structures (2-C1-2) to (2-C7-2) were fabricated in the same manner as in the fabrication of the multilayer structure (2-1-2) of Example 2-1, except for changing the drying of the applied coating liquid (S-1) from drying at 80° C. for 10 minutes to drying at 90° C. for 30 minutes (Example 2-7), to drying at 110° C. for 3 minutes (Example 2-8), to drying at 130° C. for 3 minutes (Example 2-9), to drying at 160° C. for 1 minute (Example 2-10), to drying at 80° C. for 1 minute (Example 2-11), to drying at 100° C. for 5 minutes (Comparative Example 2-1), to drying at 80° C. for 2 minutes (Comparative Example 2-2), to drying at 180° C.

for 2 seconds (Comparative Example 2-3), to drying at 180° C. for 10 seconds (Comparative Example 2-4), to drying at 180° C. for 30 seconds (Comparative Example 2-5), to drying at 180° C. for 1 minute (Comparative Example 2-6), or to drying at 180° C. for 3 minutes (Comparative Example 2-7). The various properties of the multilayer structures obtained were measured in the same manner as in Example 2-1. The results are shown in Table 2.

TABLE 2

| | Base (X) | Coating liquid (S) | | | Second coating liquid | | | | Layer (Y) precursor Solvent content (wt. %) |
|---|---|---|---|---|---|---|---|---|---|
| | | | | | | Organic | | | |
| | | No. | Al/P Molar ratio mol/mol | Drying conditions | No. | phosphorus compound (BO) Name | Poly-mer (F) Type | Weight ratio (BO):(F) | |
| Example 2-1 | X-1 | S-1 | 1.15 | 80° C., 10 minutes | — | — | — | — | 0.2 |
| Example 2-2 | X-1 | S-1 | 1.15 | 120° C., 3 minutes | — | — | — | — | 0.1 |
| Example 2-3 | X-1 | S-1 | 1.15 | 120° C., 1 minute | — | — | — | — | 0.3 |
| Example 2-4 | X-1 | S-1 | 1.15 | 80° C., 10 minutes | T-1 | PVPA | — | 100:0 | 0.2 |
| Example 2-5 | X-1 | S-1 | 1.15 | 80° C., 10 minutes | T-2 | PVPA | PVA | 91:9 | 0.2 |
| Example 2-6 | X-1 | S-1 | 1.15 | 80° C., 10 minutes | T-3 | PVPA | PEO | 91:9 | 0.2 |
| Example 2-7 | X-1 | S-1 | 1.15 | 90° C., 30 minutes | — | — | — | — | 0.02 |
| Example 2-8 | X-1 | S-1 | 1.15 | 110° C., 3 minutes | — | — | — | — | 0.4 |
| Example 2-9 | X-1 | S-1 | 1.15 | 130° C., 3 minutes | — | — | — | — | 0.1 |
| Example 2-10 | X-1 | S-1 | 1.15 | 160° C., 1 minute | — | — | — | — | 0.3 |
| Example 2-11 | X-1 | S-1 | 1.15 | 80° C., 1 minute | — | — | — | — | 0.7 |
| Comparative Example 2-1 | X-1 | S-1 | 1.15 | 100° C., 5 minutes | — | — | — | — | 0.2 |
| Comparative Example 2-2 | X-1 | S-1 | 1.15 | 80° C., 2 minutes | — | — | — | — | 0.6 |
| Comparative Example 2-3 | X-1 | S-1 | 1.15 | 180° C., 2 seconds | — | — | — | — | 3.0 |
| Comparative Example 2-4 | X-1 | S-1 | 1.15 | 180° C., 10 seconds | — | — | — | — | 1.4 |
| Comparative Example 2-5 | X-1 | S-1 | 1.15 | 180° C., 30 seconds | — | — | — | — | 0.5 |
| Comparative Example 2-6 | X-1 | S-1 | 1.15 | 180° C., 1 minute | — | — | — | — | 0.2 |
| Comparative Example 2-7 | X-1 | S-1 | 1.15 | 180° C., 3 minutes | — | — | — | — | 0.1 |

| | Layer (Y) precursor Average particle diameter (nm) | $A_R/A_P$ | Layer (Y) Thickness (μm) | Layer (Y) Average particle diameter (nm) | Oxygen transmission rate (mL/(m²·day·atm)) | | Moisture permeability (g/(m²·day)) | |
|---|---|---|---|---|---|---|---|---|
| | | | | | Before retorting | After retorting | Before retorting | After retorting |
| Example 2-1 | 4 | <1.1 | 0.3 | 30 | <0.1 | <0.1 | 0.2 | 0.2 |
| Example 2-2 | 2 | 1.9 | 0.3 | 30 | <0.1 | 0.1 | 0.1 | 0.3 |
| Example 2-3 | 3 | 1.4 | 0.45 | 30 | <0.1 | <0.1 | 0.2 | 0.2 |
| Example 2-4 | 4 | <1.1 | 0.3 | 30 | <0.1 | 0.1 | 0.2 | 0.2 |
| Example 2-5 | 4 | <1.1 | 0.3 | 30 | <0.1 | 0.1 | 0.2 | 0.3 |
| Example 2-6 | 4 | <1.1 | 0.3 | 30 | <0.1 | <0.1 | 0.1 | 0.2 |
| Example 2-7 | 2 | <1.1 | 0.3 | 20 | <0.1 | 0.1 | 0.2 | 0.2 |
| Example 2-8 | 4 | 1.8 | 0.3 | 40 | <0.1 | 0.2 | 0.1 | 0.2 |
| Example 2-9 | 4 | 2.0 | 0.3 | 50 | <0.1 | 0.3 | 0.2 | 0.3 |
| Example 2-10 | 60 | 3.2 | 0.3 | 60 | 0.2 | 1.01 | 0.6 | 1.2 |
| Example 2-11 | 4 | <1.1 | 0.3 | 60 | 0.5 | 0.8 | 0.8 | 1.5 |
| Comparative Example 2-1 | 4 | 2.2 | 0.3 | 80 | 0.2 | 2.2 | 0.2 | 5.0 |
| Comparative Example 2-2 | 4 | 1.2 | 0.3 | 80 | 0.2 | 2.2 | 0.6 | 5.8 |
| Comparative Example 2-3 | 2 | <1.1 | 0.3 | 80 | 0.2 | 2.5 | 0.6 | 5.0 |
| Comparative Example 2-4 | 10 | 2.2 | 0.3 | 80 | 0.2 | 2.4 | 0.6 | 5.9 |
| Comparative Example 2-5 | 20 | 2.5 | 0.3 | 80 | 0.2 | 2.3 | 0.6 | 5.0 |

TABLE 2-continued

| | | | | | | | | |
|---|---|---|---|---|---|---|---|---|
| Comparative Example 2-6 | 60 | 3.3 | 0.3 | 100 | 0.6 | 2.8 | 1.2 | 5.5 |
| Comparative Example 2-7 | 80 | 3.8 | 0.3 | 100 | 0.6 | 2.8 | 1.2 | 5.6 |

In this table, the average particle diameter indicated for the layer (Y) refers to the average particle diameter of the reaction product (D), while the average particle diameter indicated for the layer (Y) precursor refers to the average particle diameter of the reaction product (D) precursor.
[Abbreviations in table]
PVPA: Poly(vinylphosphonic acid)
PVA: Polyvinyl alcohol
PEO: Polyethylene oxide

Example 3

Vertical Form-Fill-Seal Bag

Example 3-1

The multilayer structure (1-1-2) as fabricated in Example 1-1 was cut into a 400-mm-wide piece, which was fed to a vertical form-fill-seal packaging machine (manufactured by ORIHIRO Co., Ltd.) in such a manner that the heat sealing was performed with CPP layers being in contact with each other. Using the vertical form-fill-seal packaging machine, a vertical form-fill-seal bag (3-1-3) of the fin seal type (having a width of 160 mm and a length of 470 mm) as shown in FIG. 1 was fabricated. The oxygen transmission rate and moisture permeability of the vertical form-fill-seal bag (3-1-3) not having undergone retorting were measured. The results are shown in Table 3. The vertical form-fill-seal bag (3-1-3) was heat-sealed to form a pouch, and the pouch was filled with 300 mL of water. The pouch obtained was then subjected to retorting (hot water retaining method) under the same conditions as in Example 1-1. Immediately after the hot water treatment, a measurement sample was cut out from the pouch, and the oxygen transmission rate and moisture permeability of the sample were measured. The results are shown in Table 3.

Comparative Examples 3-1 and 3-2

Vertical form-fill-seal bags (C3-1-3) and (C3-2-3) were fabricated in the same manner as in the fabrication of the vertical form-fill-seal bag (3-1-3) of Example 3-1, except for using, instead of the multilayer structure (1-1-2), the multilayer structures (C1-1-2) and (C1-3-2) fabricated in Comparative Examples 1-1 and 1-2. The various properties of the vertical form-fill-seal bags (C3-1-3) and (C3-2-3) obtained were measured in the same manner as in Example 3-1. The results are shown in Table 3.

Example 4

Flat Pouch

Example 4-1

The multilayer structure (1-1-2) as fabricated in Example 1-1 was cut into two pieces having a size of 120 mm×120 mm, and the two pieces of the multilayer structure were stacked together in such a manner that the CPP layers were located interiorly. The resulting rectangular stack was heat-sealed at its three sides to form a flat pouch (4-1-3). The oxygen transmission rate and moisture permeability of the flat pouch (4-1-3) not having undergone retorting were measured. The results are shown in Table 4. The flat pouch was filled with 100 mL of water. The flat pouch obtained was then subjected to retorting (hot water retaining method) under the same conditions as in Example 1-1. Immediately after the hot water treatment, a measurement sample was cut out from the flat pouch, and the oxygen transmission rate and moisture permeability of the sample were measured. The results are shown in Table 4.

Comparative Examples 4-1 and 4-2

Flat pouches (C4-1-3) and (C4-2-3) were fabricated in the same manner as in the fabrication of the flat pouch (4-1-3) of Example 4-1, except for using, instead of the multilayer structure (1-1-2), the multilayer structures (C1-1-2) and (C1-2-2) fabricated in Comparative Examples 1-1 and 1-2. The various properties of the flat pouches obtained were measured in the same manner as in Example 4-1. The results are shown in Table 4.

TABLE 3

| | Vertical form-fill-seal bag No. | Multilayer structure No. | Before treatment | | After retorting | | Reaction product (D) Average particle diameter (nm) | Light transmittance (420 nm) (%) |
|---|---|---|---|---|---|---|---|---|
| | | | Oxygen transmission rate (mL/(m$^2$ · day · atm)) | Moisture permeability (g/(m$^2$ · day)) | Oxygen transmission rate (mL/(m$^2$ · day · atm)) | Moisture permeability (g/(m$^2$ · day)) | | |
| Example 3-1 | 3-1-3 | 1-1-2 | 0.3 | 0.3 | 0.2 | 0.3 | 60 | 88.0 |
| Comparative Example 3-1 | C3-1-3 | C1-1-2 | <0.1 | 0.4 | 3.2 | 8.7 | <5 | 87.7 |
| Comparative Example 3-2 | C3-2-3 | C1-2-2 | >20 | >20 | >20 | >20 | >100 | 86.4 |

TABLE 4

| | Flat pouch No. | Multilayer structure No. | Before treatment | | After retorting | | Reaction product (D) | |
| | | | Oxygen transmission rate (mL/($m^2 \cdot$ day $\cdot$ atm)) | Moisture permeability (g/($m^2 \cdot$ day)) | Oxygen transmission rate (mL/($m^2 \cdot$ day $\cdot$ atm)) | Moisture permeability (g/($m^2 \cdot$ day)) | Average particle diameter (nm) | Light transmittance (420 nm) (%) |
|---|---|---|---|---|---|---|---|---|
| Example 4-1 | 4-1-3 | 1-1-2 | 0.2 | 0.2 | 0.1 | 0.1 | 60 | 88.0 |
| Comparative Example 4-1 | C4-1-3 | C1-1-2 | <0.1 | 0.4 | 3.4 | 9.4 | <5 | 87.7 |
| Comparative Example 4-2 | C4-2-3 | C1-2-2 | >20 | >20 | >20 | >20 | >100 | 86.4 |

Example 5

Infusion Bag

Example 5-1

Two pieces of multilayer structure having a size of 12 cm×10 cm were cut out from the multilayer structure (1-1-2) as fabricated in Example 1-1. The two cut-out pieces of multilayer structure were then stacked together in such a manner that the CPP layers were located interiorly. The periphery of the resulting stack was heat-sealed, and a spout (plug member) made of polypropylene was attached by heat sealing. In this way, an infusion bag (5-1-3) having the same configuration as that shown in FIG. 3 was fabricated. The oxygen transmission rate and moisture permeability of the infusion bag (5-1-3) not having undergone retorting were measured. The results are shown in Table 5.

Subsequently, the infusion bag (5-1-3) was filled with 100 mL of water. The infusion bag obtained was then subjected to retorting (hot water retaining method) under the same conditions as in Example 1-1. Immediately after the hot water treatment, a measurement sample was cut out from the infusion bag, and the oxygen transmission rate and moisture permeability of the sample were measured. The results are shown in Table 5.

Comparative Examples 5-1 and 5-2

Infusion bags (C5-1-3) and (C5-2-3) were fabricated in the same manner as in the fabrication of the infusion bag (5-1-3) of Example 5-1, except for using, instead of the multilayer structure (1-1-2), the multilayer structures (C1-1-2) and (C1-2-2) fabricated in Comparative Examples 1-1 and 1-2. The various properties of the infusion bags obtained were measured in the same manner as in Example 5-1. The results are shown in Table 5.

Example 6

Container Lid

Example 6-1

A 100-mm-diameter circular piece of multilayer structure was cut out from the multilayer structure (1-1-2) as fabricated in Example 1-1, and was used as a lid for a container. A flanged container ("Hi-Retoflex" (registered trademark) "HR78-84" (product name) manufactured by Toyo Seikan Co., Ltd.) was prepared for use as a container body. This container has the shape of a 30-mm-high cup whose top surface has a diameter of 78 mm. The top surface of the container is open, and the width of the flange portion formed along the periphery of the top surface is 6.5 mm. The container is made up of a three-layered product having a configuration of "olefin layer/steel layer/olefin layer". The container body was almost completely filled with water, and the lid was heat-sealed to the flange portion, thus obtaining a lidded container (6-1-3). In this heat-sealing of the lid, the lid was set in such a manner that the CPP layer of the lid was in contact with the flange portion. A measurement sample in the shape of a square 4.5 cm on a side was cut out from the lid of the lidded container (6-1-3), and placed on a 10-cm-square aluminum foil (of 30 μm thickness) to cover a 2.0-cm-diameter circular hole made in the foil. The gap between the sample and the aluminum foil was sealed with a two-component curable epoxy adhesive. Using the sample, the oxygen transmission rate and moisture permeability were measured before retorting. The results are shown in Table 6. The lidded container obtained was then subjected to retorting (hot water retaining method) under the same conditions as in Example 1-1. Immediately after the hot water treatment, a measurement sample was cut out from the lid, and the oxygen transmission rate and moisture permeability

TABLE 5

| | Infusion bag No. | Multilayer structure No. | Before treatment | | After retorting | | Reaction product (D) | |
| | | | Oxygen transmission rate (mL/($m^2 \cdot$ day $\cdot$ atm)) | Moisture permeability (g/($m^2 \cdot$ day)) | Oxygen transmission rate (mL/($m^2 \cdot$ day $\cdot$ atm)) | Moisture permeability (g/($m^2 \cdot$ day)) | Average particle diameter (nm) | Light transmittance (420 nm) (%) |
|---|---|---|---|---|---|---|---|---|
| Example 5-1 | 5-1-3 | 1-1-2 | 0.2 | 0.3 | 0.1 | 0.1 | 60 | 88.0 |
| Comparative Example 5-1 | C5-1-3 | C1-1-2 | <0.1 | 0.4 | 3.1 | 9.2 | <5 | 87.7 |
| Comparative Example 5-2 | C5-2-3 | C1-2-2 | >20 | >20 | >20 | >20 | >100 | 86.4 | of the sample were measured in the same manner as those measured before retorting. The results are shown in Table 6.

Comparative Examples 6-1 and 6-2

Lidded containers (C6-1-3) and (C6-2-3) were fabricated in the same manner as in the fabrication of the lidded container (6-1-3) of Example 6-1, except for using, instead of the multilayer structure (1-1-2), the multilayer structures (C1-1-2) and (C1-2-2) fabricated in Comparative Examples 1-1 and 1-2. The various properties of the lidded containers obtained were measured in the same manner as in Example 6-1. The results are shown in Table 6.

mold, and attached to the inner wall surface of the female mold member. A male mold member was then pressed into the female mold member. Next, molten polypropylene ("EA7A" of "NOVATEC" (registered trademark) manufactured by Japan Polypropylene Corporation) was injected into the cavity between the male mold member and female mold member at 220° C. Injection molding was carried out in this way to form the intended container (7-1-3). The container body had a thickness of 700 μm and a surface area of 83 cm². The entire exterior of the container was covered with the multilayer label (7-1-2); that is, the multilayer label (7-1-2) overlapped the seam so that the exterior of the container was

TABLE 6

| | Lidded container No. | Multi-layer structure No. | Before treatment Oxygen transmission rate (mL/(m² · day · atm)) | Before treatment Moisture permeability (g/(m² · day) | After retorting Oxygen transmission rate (mL/(m² · day · atm)) | After retorting Moisture permeability (g/(m² · day) | Reaction product (D) Average particle diameter (nm) | Light transmittance (420 nm) (%) |
|---|---|---|---|---|---|---|---|---|
| Example 6-1 | 6-1-3 | 1-1-2 | 0.2 | 0.2 | 0.2 | 0.2 | 60 | 88.0 |
| Comparative Example 6-1 | C6-1-3 | C1-1-2 | <0.1 | 0.4 | 3.5 | 9.8 | <5 | 87.7 |
| Comparative Example 6-2 | C6-2-3 | C1-2-2 | >20 | >20 | >20 | >20 | >100 | 86.4 |

Example 7

In-Mold Labeled Container

Example 7-1

A two-component adhesive was applied to two CPP 100s using a bar coater in such a manner that the dry thickness would be 3 μm, and the adhesive was dried. The two-component adhesive used was a two-component reactive polyurethane adhesive composed of "A-525S" of "TAKE-LAC" (registered trademark) manufactured by Mitsui Chemicals, Inc. and "A-50" of "TAKENATE" (registered trademark) manufactured by Mitsui Chemicals, Inc. Next, the two CPPs and the multilayer structure (1-1-1) of Example 1-1 were laminated together, and the resulting free of any area that was not covered by the multilayer label (7-1-2). The appearance of the container (7-1-3) was good.

Comparative Examples 7-1 and 7-2

Multilayer labels (C7-1-2) and (C7-2-2) were fabricated in the same manner as in the fabrication of the multilayer label (7-1-2) of Example 7-1, except for using, instead of the multilayer structure (1-1-1), the multilayer structures (C1-1-1) and (C1-2-1) fabricated in Comparative Examples 1-1 to 1-2. Containers (C7-1-3) and (C7-2-3) were then fabricated in the same manner as in the fabrication of the container (7-1-3), except for using the multilayer labels (C7-1-2) and (C7-2-2) instead of the multilayer label (7-1-2) of Example 7-1. The containers (C7-1-3) and (C7-2-3) had insufficient transparency. The various properties of the multilayer labels obtained were measured in the same manner as in Example 7-1. The results are shown in Table 7.

TABLE 7

| | Multilayer label No. | Multilayer structure No. | Oxygen transmission rate (mL/(m² · day · atm)) | Moisture permeability (g/(m² · day)) | Container Appearance Transparency | Reaction product (D) Average particle diameter (nm) | Light transmittance (420 nm) (%) |
|---|---|---|---|---|---|---|---|
| Example 7-1 | 7-1-2 | 1-1-1 | 0.2 | 0.3 | Good | 60 | 88.0 |
| Comparative Example 7-1 | C7-1-2 | C1-1-1 | <0.1 | 0.4 | Poor | <5 | 87.7 |
| Comparative Example 7-2 | C7-2-2 | C1-2-1 | >20 | >20 | Very poor | >100 | 86.4 | laminate was allowed to stand at 40° C. for 5 days for aging. In this way, a multilayer label (7-1-2) having a configuration of "CPP/adhesive layer/base (X-1)/layer (Y-1-1)/adhesive layer/CPP" was obtained. The oxygen transmission rate and moisture permeability of the multilayer label (7-1-2) obtained were measured by the methods previously described.

The multilayer label (7-1-2) was cut to fit the inner wall surface of a female mold member of a container-forming Example 8

Extrusion Coating Lamination

Example 8-1

An adhesive layer was formed on the layer (Y) of the multilayer structure (1-1-1) of Example 1-1, and a polyethylene resin (having a density of 0.917 g/cm³ and a melt flow rate of 8 g/10 min) was then applied onto the adhesive layer by extrusion coating lamination at 295° C. in such a manner that the applied resin had a thickness of 20 μm. In this way, a laminate (8-1-2) having a configuration of "base (X-1)/layer (Y-1-1)/adhesive layer (G)/polyethylene" was obtained. The adhesive layer (G) was formed by applying a two-component adhesive using a bar coater in such a manner that the dry thickness would be 0.3 μm, and then by drying the adhesive. This two-component adhesive used was a two-component reactive polyurethane adhesive composed of "A-3210" of "TAKELAC" (registered trademark) manufactured by Mitsui Chemicals, Inc. and "A-3070" of "TAKENATE" (registered trademark) manufactured by Mitsui Chemicals, Inc.

The oxygen transmission rate and moisture permeability of the laminate (8-1-2) were measured by the methods previously described. The results are shown in Table 8.

Comparative Examples 8-1 and 8-2

Laminates (C8-1-2) and (C8-2-2) were fabricated in the same manner as in Example 8-1, except for using, instead of the multilayer structure (1-1-1), the multilayer structures (C1-1-1) and (C1-2-1) of Comparative Examples 1-1 and 1-2. The various properties of the laminates obtained were measured in the same manner as in Example 8-1. The results are shown in Table 8.

solution with a pH of 2 (Example 9-4), an edible oil (Example 9-5), ketchup (Example 9-6), soy sauce (Example 9-7), and a ginger paste (Example 9-8). In any case, the oxygen transmission rate of the sample having undergone the retorting was 0.2 mL/($m^2$·day·atm). In addition, a lidded container (7-1-3) as fabricated in Example 7-1 was almost completely filled with mikan in syrup and was subjected to retorting in the same manner as in Example 9-1 (Example 9-9). A measurement sample was cut out from the lid of the lidded container having undergone the retorting, and the oxygen transmission rate of the sample was measured. The oxygen transmission rate was 0.2 mL/($m^2$·day·atm).

As clearly demonstrated by Examples 9-1 to 9-9, the packaging materials of the present invention showed good barrier performance even after undergoing retorting with various food products contained therein.

Example 10

Vacuum Insulator

Example 10-1

The two-component adhesive as used in Example 7-1 was applied onto a CPP 60 in such a manner that the dry thickness would be 3 μm, and the adhesive was dried to form an adhesive layer on the CPP 60. This CPP was bonded to

TABLE 8

| | Laminate No. | Multilayer structure No. | Oxygen transmission rate (mL/($m^2$ · day · atm)) | Moisture permeability (g/($m^2$ · day)) | Reaction product (D) Average particle diameter (nm) | Light transmittance (420 nm) (%) |
|---|---|---|---|---|---|---|
| Example 8-1 | 8-1-2 | 1-1-1 | 0.3 | 0.4 | 60 | 88.0 |
| Comparative Example 8-1 | C8-1-2 | C1-1-1 | 0.1 | 0.6 | <5 | 87.7 |
| Comparative Example 8-2 | C8-2-2 | C1-2-1 | >20 | >20 | >100 | 86.4 |

Example 9

Influence of Contained Material

Example 9-1

A flat pouch (4-1-3) as fabricated in Example 4-1 was filled with 500 mL of a 1.5% aqueous ethanol solution, and subjected to retorting using a retorting apparatus (Flavor Ace RCS-60, manufactured by HISAKA WORKS, LTD.) in hot water at 120° C. and 0.15 MPaG for 30 minutes. A measurement sample was cut out from the flat pouch having undergone the retorting, and the oxygen transmission rate of the sample was measured. The oxygen transmission rate of the sample was 0.2 mL/($m^2$·day·atm).

Examples 9-2 to 9-9

Flat pouches (4-1-3) were subjected to retorting in the same manner as in Example 9-1, except for using other materials instead of the 1.5% aqueous ethanol solution and filling each flat pouch (4-1-3) with 500 mL of one of the other materials. A measurement sample was cut out from each flat pouch having undergone the retorting, and the oxygen transmission rate of the sample was measured. The other materials were a 1.0% aqueous ethanol solution (Example 9-2), vinegar (Example 9-3), an aqueous citric acid the PET layer of the multilayer structure (1-1-2) as fabricated in Example 1-1 to obtain a layered product (10-1-1). The above two-component reactive polyurethane adhesive was then applied onto an ONY in such a manner that the dry thickness would be 3 μm, and the adhesive was dried to form an adhesive layer on the ONY. This ONY and the layered product (10-1-1) were bonded together to obtain a multilayer structure (10-1-2) having a configuration of "CPP/adhesive layer/multilayer structure/adhesive layer/ONY".

The multilayer structure (10-1-2) was cut to give two laminates having a size of 70 cm×30 cm. The two laminates were stacked together in such a manner that the CPP layers would form inner surfaces of a bag to be fabricated, and the stack was heat-sealed at its three sides with a seal width of 10 mm. A three-side-seal bag was thus fabricated. Next, a heat-insulating core material was put into the three-side-seal bag through its opening, and the three-side-seal bag was hermetically closed using a vacuum packaging machine so that the internal pressure was 10 Pa at 20° C. In this way, a vacuum insulator (10-1-3) was obtained. The heat-insulating core material used was a fine silica powder. The vacuum insulator (10-1-3) was left at 40° C. and 15% RH for 360 days, after which the internal pressure of the vacuum insulator was measured using a Pirani gauge. The measured pressure was 37.0 Pa.

A measurement sample was cut out from the vacuum insulator (10-1-3), and the oxygen transmission rate and water vapor transmission rate of the sample were measured. The results are shown in Table 9.

Comparative Examples 10-1 and 10-2

Vacuum insulators (C10-1-3) and (C10-2-3) were fabricated in the same manner as in the fabrication of the vacuum insulator (10-1-3) of Example 10-1, except for using, instead of the multilayer structure (1-1-2), the multilayer structures (C1-1-2) and (C1-2-2) of Comparative Examples 1-1 and 1-2. The various properties of the vacuum insulators obtained were measured in the same manner as in Example 10-1. The results are shown in Table 9.

test) in which the protective sheet was stored at atmospheric pressure, 85° C., and 85% RH for 1,000 hours using a thermo-hygrostat. The results of measurement of the oxygen transmission rate and moisture permeability of the protective sheet having undergone the test are shown in Table 10.

Comparative Examples 11-1 and 11-2

Protective sheets (C11-1-2) and (C11-2-2) were fabricated in the same manner as in the fabrication of the protective

TABLE 9

|  | Vacuum insulator No. | Multilayer structure No. | Oxygen transmission rate (mL/(m$^2$ · day · atm)) | Moisture permeability (g/(m$^2$ · day)) | Reaction product (D) Average particle diameter (nm) | Light transmittance (420 nm) (%) |
|---|---|---|---|---|---|---|
| Example 10-1 | 10-1-3 | 1-1-2 | 0.2 | 0.2 | 60 | 88.0 |
| Comparative Example 10-1 | C10-1-3 | C1-1-2 | <0.1 | 0.4 | <5 | 87.7 |
| Comparative Example 10-2 | C10-2-3 | C1-2-2 | >20 | >20 | >100 | 86.4 |

Example 11-1

An adhesive layer was formed on the multilayer structure (1-1-1) as fabricated in Example 1-1, and an acrylic resin film (of 50 μm thickness) was laminated on the adhesive layer to obtain a layered product. An adhesive layer was subsequently formed on the multilayer structure (1-1-1) of the layered product, to which a PET 50 was then laminated. In this way, a protective sheet (11-1-2) having a configuration of "PET/adhesive layer/base (X-1)/layer (Y-1-1)/adhesive layer/acrylic resin film" was obtained. The two adhesive layers were each formed by applying a two-component adhesive in such a manner that the dry thickness would be 3 μm and then by drying the adhesive. The two-component adhesive used was a two-component reactive polyurethane adhesive composed of "A-1102" of "TAKELAC" (registered trademark) manufactured by Mitsui Chemicals, Inc. and "A-3070" of "TAKENATE" (registered trademark) manufactured by Mitsui Chemicals, Inc.

The oxygen transmission rate and moisture permeability of the protective sheet (11-1-2) obtained were measured. The results are shown in Table 10.

Subsequently, the protective sheet (11-1-2) obtained was examined for durability by performing a test (damp heat test) in which the protective sheet was stored at atmospheric pressure, 85° C., and 85% RH for 1,000 hours using a thermo-hygrostat. The results of measurement of the oxygen transmission rate and moisture permeability of the protective sheet having undergone the test are shown in Table 10.

sheet (11-1-1) of Example 11-1, except for using, instead of the multilayer structure (1-1-1), the multilayer structures (C1-1-1) and (C1-2-1) fabricated in Comparative Examples 1-1 and 1-2. The various properties of the protective sheets obtained were measured in the same manner as in Example 11-1. The results are shown in Table 10. The protective sheet (C11-1-2) was observed to have suffered partial delamination as a result of the damp heat test.

TABLE 10

|  |  |  | Before damp heat test | | After damp heat test | | Reaction | |
|---|---|---|---|---|---|---|---|---|
|  | Protective sheet No. | Multilayer structure No. | Oxygen transmission rate (mL/(m$^2$ · day · atm)) | Moisture permeability (g/(m$^2$ · day)) | Oxygen transmission rate (mL/(m$^2$ · day · atm)) | Moisture permeability (g/(m$^2$ · day)) | product (D) Average particle diameter (nm) | Light transmittance (420 nm) (%) |
| Example 11-1 | 11-1-2 | 1-1-1 | 0.2 | 0.2 | 0.2 | 0.2 | 60 | 88.0 |
| Comparative Example 11-1 | C11-1-2 | C1-1-1 | <0.1 | 0.2 | Delamination | Delamination | <5 | 87.7 |
| Comparative Example 11-2 | C11-2-2 | C1-2-1 | >20 | >20 | — | — | >100 | 86.4 |

INDUSTRIAL APPLICABILITY

The present invention is applicable to a multilayer structure and a packaging material including the multilayer structure. The present invention makes it possible to obtain a multilayer structure having high transparency and capable of maintaining high barrier performance even after retorting. The use of the multilayer structure of the present invention makes it possible to obtain a good packaging material. The present invention is further applicable to a protective sheet including a multilayer structure.

The invention claimed is:
1. A multilayer structure, comprising a base (X) and a layer (Y) stacked on the base (X), wherein:

the layer (Y) comprises a reaction product (D) of an aluminum-containing compound (A) and a phosphorus compound (B), and the reaction product (D) has an average particle diameter of 5 to 70 nm.

2. The multilayer structure according to claim 1, wherein the phosphorus compound (B) is an inorganic phosphorus compound (BI).

3. The multilayer structure according to claim 1, wherein the aluminum-containing compound (A) is an aluminum-containing metal oxide (Aa).

4. The multilayer structure according to claim 1, wherein the base (X) comprises at least one layer selected from the group consisting of a thermoplastic resin film layer and a paper layer.

5. A method for producing the multilayer structure according to claim 1 the method comprising:
(I) applying a coating liquid (S) comprising the aluminum-containing compound (A), the phosphorus compound (B), and a solvent onto the base (X) to form a layer (Y) precursor comprising a reaction product (D) precursor; and
(II) heat-treating the layer (Y) precursor at a temperature of 140° C. or higher to form the layer (Y),
wherein:
the layer (Y) precursor formed in the step (I) has a solvent content of 0.4 wt % or less, and
the reaction product (D) precursor has an average particle diameter of less than 5 nm.

6. The production method according to claim 5, wherein the step (I) comprises a drying step of removing the solvent from the coating liquid (S) after applying the coating liquid (S) onto the base (X), and a drying temperature in the drying step is lower than 140° C.

7. The production method according to claim 6, wherein, in an infrared absorption spectrum of the layer (Y) precursor obtained in the step (I), a ratio $A_R/A_P$ of a maximum $A_R$ of absorbance in a region from 1,080 to 1,130 $cm^{-1}$ to a maximum $A_P$ of absorbance in a region from 850 to 950 $cm^{-1}$ is 2.0 or less.

8. A packaging material, comprising the multilayer structure according to claim 1.

9. The packaging material according to claim 8, further comprising a layer formed by extrusion coating lamination.

10. The packaging material according to claim 8, being a vertical form-fill-seal bag, a vacuum packaging bag, a pouch, a laminated tube container, an infusion bag, a paper container, a strip tape, a container lid, or an in-mold labeled container.

11. A product, comprising the packaging material according to claim 8 in at least a part of the product.

12. The product according to claim 11, which is adapted to function as a vacuum insulator, the product having an interior with a reduced pressure, the product comprising a substance contained in the interior, the substance being a core material.

13. A protective sheet for electronic devices, comprising the multilayer structure according to claim 1.

14. The protective sheet for electronic devices according to claim 13, being a protective sheet for protecting a surface of a photoelectric conversion device, information display device, or lighting device.

15. An electronic device, comprising the protective sheet according to claim 13.

16. The multilayer structure according to claim 1, having an oxygen transmission rate of 2 $mL/m^2 \cdot day \cdot atm$ or less at 20° C. and 85% RH after retorting under 130° C. for 60 minutes.

* * * * *